US012783431B2

(12) United States Patent

Kim et al.

(10) Patent No.: US 12,783,431 B2

(45) Date of Patent: Nov. 3, 2026

(54) LOGIC DIE AND SEMICONDUCTOR DEVICE INCLUDING LOGIC DIE

(71) Applicant: SAMSUNG ELECTRONICS CO., LTD., Suwon-si (KR)

(72) Inventors: Geonho Kim, Suwon-si (KR); Kyeongkeun Kang, Suwon-si (KR); Shinyoung Yi, Suwon-si (KR); Kwanyeob Chae, Suwon-si (KR); Ilho Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/988,879

(22) Filed: Dec. 19, 2024

(65) Prior Publication Data

US 2025/0265205 A1 Aug. 21, 2025

(30) Foreign Application Priority Data

Feb. 21, 2024 (KR) ........................ 10-2024-0025310
Apr. 18, 2024 (KR) ........................ 10-2024-0052399

(51) Int. Cl.
*G06F 13/16* (2006.01)
*H10W 20/20* (2026.01)
(Continued)

(52) U.S. Cl.
CPC ........ *G06F 13/1668* (2013.01); *H10W 20/20* (2026.01); *H10W 90/00* (2026.01); *G06F 2213/16* (2013.01); *H10B 80/00* (2023.02)

(58) Field of Classification Search
CPC ............ G06F 13/1668; G06F 2213/16; H10W 20/20; H10W 90/00; H10B 80/00;
(Continued)

(56) References Cited

U.S. PATENT DOCUMENTS 8,400,805 B2 3/2013 Yoko
8,743,582 B2 6/2014 Kang et al.
(Continued)

FOREIGN PATENT DOCUMENTS

KR 10-1751045 6/2017
WO WO 2013-095676 A1 6/2013

OTHER PUBLICATIONS

Extended European Search Report in European Appln. No. 24218731.8, mailed on Feb. 21, 2025, 10 pages.

*Primary Examiner* — Farley Abad

(74) *Attorney, Agent, or Firm* — Fish & Richardson P.C.

(57) ABSTRACT

Provided are a logic die for supporting direct interfacing between a memory die and a memory controller via a through silicon via (TSV) and a semiconductor device including the logic die. The semiconductor device includes a logic die including a memory controller, an interface circuit, and a plurality of TSVs arranged in a TSV region. A plurality of memory dies stacked vertically on the logic die, and connected to the plurality of TSVs. The memory controller operates in a first voltage domain, and the plurality of memory dies operate in a second voltage domain. The interface circuit includes a plurality of TSV circuit blocks connected to the plurality of TSVs. Each TSV circuit block is configured to convert a voltage level of a signal, transmitted via a corresponding TSV, between a first voltage level in the first voltage domain and a second voltage level in the second voltage domain.

20 Claims, 43 Drawing Sheets

(51) Int. Cl.
*H10W 90/00* (2026.01)
*H10B 80/00* (2023.01)

(58) Field of Classification Search
CPC ....... G11C 5/063; G11C 5/147; G11C 7/1084; G11C 5/025; G11C 7/222
See application file for complete search history.

(56) References Cited

U.S. PATENT DOCUMENTS

| | | | | |
|---|---|---|---|---|
| 2012/0250387 | A1* | 10/2012 | Kondo | G11C 5/06 365/51 |
| 2013/0070540 | A1* | 3/2013 | Pyeon | G11C 11/4074 327/564 |
| 2013/0279276 | A1* | 10/2013 | Schaefer | G11C 7/00 365/189.011 |
| 2014/0313844 | A1 | 10/2014 | Lin | |
| 2016/0359566 | A1 | 12/2016 | Yu et al. | |
| 2017/0110406 | A1 | 4/2017 | Yang et al. | |
| 2022/0028789 | A1* | 1/2022 | Kirby | H10W 70/611 |
| 2023/0187407 | A1 | 6/2023 | Molnar et al. | |

* cited by examiner

600

LOGIC DIE AND SEMICONDUCTOR DEVICE INCLUDING LOGIC DIE

CROSS-REFERENCE TO RELATED APPLICATION

This application is based on and claims priority under 35 U.S.C. § 119 to Korean Patent Application Nos. 10-2024-0025310, filed on Feb. 21, 2024, and 10-2024-0052399, filed on Apr. 18, 2024, in the Korean Intellectual Property Office, the disclosures of which are incorporated by reference herein in their entireties.

BACKGROUND

Example semiconductor devices include dynamic random access memory (DRAM), which is a volatile memory that determines data based on electric charge stored in a capacitor. The DRAM can be high-bandwidth memory (HBM), which provides input and output in a multi-channel interface. HBM is used in various systems, such as graphics, servers, supercomputers, and networks that demand high performance and low power. HBM may include a base die and core dies stacked vertically on the base die, and the base die may be connected to the core dies via a plurality of through silicon vias (TSVs). Generally, communication through an interposer provides the interface between a memory controller of an external die and core dies of an HBM. This structure may cause latency during signal transmission and reception.

SUMMARY

The present disclosure provides a logic die, which supports direct interfacing between a memory controller and core dies using through silicon vias (TSVs), and a semiconductor device including the logic die.

In a first general aspect, a semiconductor device includes: a logic die including a memory controller, an interface circuit, and a plurality of TSVs arranged in a TSV region, wherein the memory controller operates in a first voltage domain, and a plurality of memory dies stacked vertically on the logic die, operating in a second voltage domain, and connected to the plurality of TSVs, wherein the interface circuit includes a plurality of TSV circuit blocks being in the TSV region and connected to the plurality of TSVs in the TSV region, and each of the plurality of TSV circuit blocks is configured to convert a voltage level of a signal transmitted via a corresponding TSV among the plurality of TSVs, between a first voltage level in the first voltage domain and a second voltage level in the second voltage domain.

In a second general aspect, a logic die includes: a memory controller operating in a first clock domain, a plurality of through silicon vias (TSVs) arranged in a TSV region and electrically connected to a plurality of memory dies operating in a second clock domain, and an interface circuit between the memory controller and the plurality of TSVs, wherein the interface circuit includes a plurality of TSV macros arranged, in the TSV region, in an array form and connected to the plurality of TSVs, and each of the plurality of TSV macros is configured to synchronize signals received from the plurality of memory dies with a controller clock according to the first clock domain or synchronize a signal received from the memory controller with a memory clock according to the second clock domain.

In a third general aspect, a logic die includes: a memory controller operating in a first voltage domain, a plurality of through silicon vias (TSVs) arranged in a TSV region and electrically connected to a plurality of memory dies operating in a second voltage domain, and an interface circuit between the memory controller and the plurality of TSVs, wherein the interface circuit includes a plurality of TSV macros arranged, in the TSV region, in an array form and connected to the plurality of TSVs, and each of the plurality of TSV macros is configured to convert a voltage level of a signal, transmitted via a corresponding TSV among the plurality of TSVs, between a first voltage level in the first voltage domain and a second voltage level in the second voltage domain.

BRIEF DESCRIPTION OF THE DRAWINGS

In the drawings, the same reference numerals are given to the same elements, and repeated descriptions thereof are omitted.

DETAILED DESCRIPTION

Figure 1:
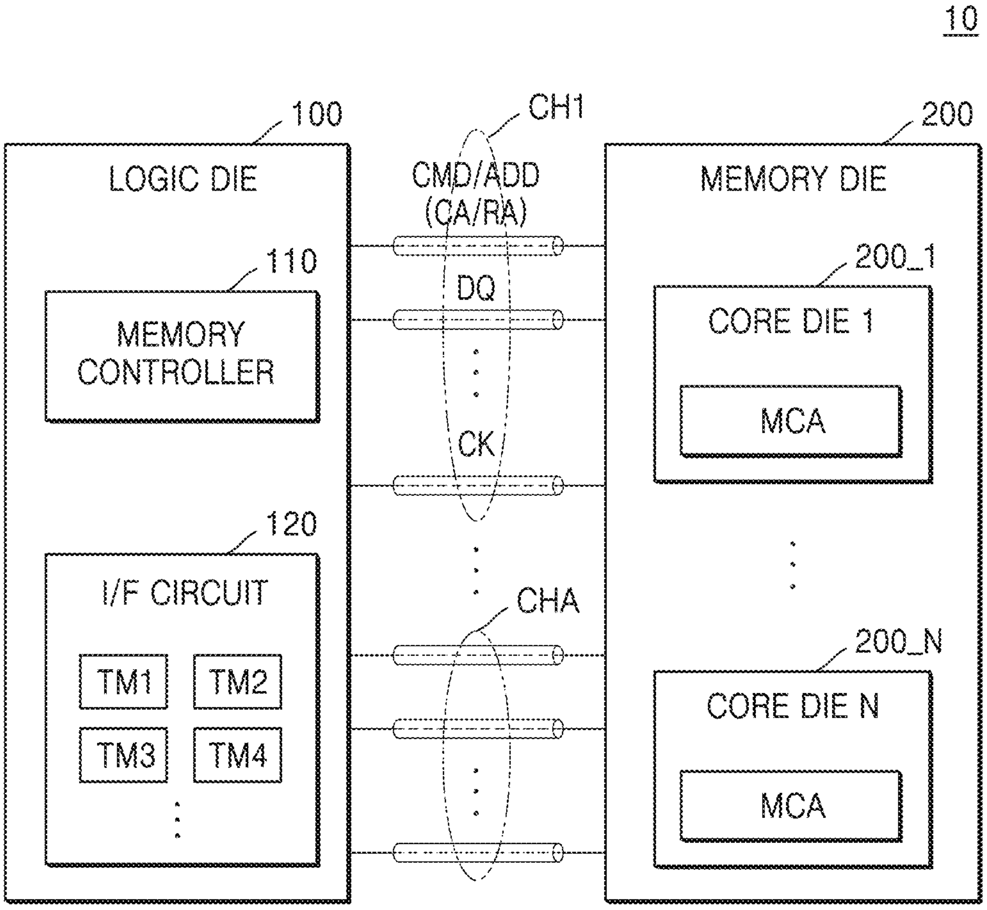
FIG. 1 is a block diagram showing an example of a semiconductor device.

FIG. 1 is a block diagram showing an example of a semiconductor device 10.

Referring to FIG. 1, the semiconductor device 10 includes a logic die 100 and a memory die 200. In some implementations, the semiconductor device 10 may be referred to as a memory device, a memory system, a storage device, or a storage system. In some implementations, the logic die 100 may be referred to as a logic chip, a base die, a controller, a controller chip, a controller die, or a host. In some implementations, the memory die 200 may be referred to as a memory chip or a core die. For example, the memory die 200 may include a plurality of memory dies or a plurality of core dies 200_1 to 200_N (e.g., first core die 200_1 to Nth core die 200_N) (where N is a natural number of 2 or more), each of which includes a memory cell array MCA. The number of core dies in the memory die 200 may vary.

The logic die 100 includes a memory controller 110 and an interface circuit 120. The memory controller 110 may control all operations on the memory die 200, including write operations and read operations on the memory die 200. The interface circuit 120 may perform interfacing between the memory controller 110 and the memory die 200. In some implementations, the interface circuit 120 may be referred to as a memory interface or a memory interface circuit. Specifically, the interface circuit 120 may support direct interfacing for data and clocks of a controller domain corresponding to the memory controller 110 and data and clocks of a memory domain corresponding to the memory die 200.

The logic die 100 may transmit a command/address CMD/ADDR and a clock signal CK to the memory die 200 via the interface circuit 120. For example, the command/address CMD/ADDR may include a column address CA and a row address RA, that is, a column/row address CA/RA. In addition, the logic die 100 may transmit data DQ, e.g., write data, to the memory die 200 via the interface circuit 120 or receive data DQ, e.g., read data, from the memory die 200.

In some implementations, the semiconductor device 10 may be provided as a high-bandwidth memory (HBM). Also, the semiconductor device 10 may provide a wide interface architecture using a multi-channel interface between the logic die 100 and the memory die 200 for high-speed and low-power operation. For example, each of the plurality of core dies 200_1 to 200_N may support 4-channels, and thus, the memory die 200 may support 16-channels. However, examples are not limited thereto, and each of the plurality of core dies 200_1 to 200_N may support 1-channel, 2-channels, 4-channels, or more.

In some implementations, the logic die 100 and the plurality of core dies 200_1 to 200_N may communicate with each other via through silicon vias (TSVs) and/or through backside vias (TBVs). Also, each of the plurality of core dies 200_1 to 200_N may include a plurality of channels that independently communicate with the logic die 100, and the TSVs and/or TBVs may be arranged so as to be physically separated from each other for the plurality of channels. For example, when the memory die 200 includes first to A-th channels CH1 to CHA and each of the plurality of core dies 200_1 to 200_N includes two channels, A channels may correspond to 2×N channels (A is a natural number of 2 or more). Also, when each of the plurality of core dies 200_1 to 200_N includes 4 channels, A channels may correspond to 4×N channels.

The interface circuit 120 may include a plurality of input/output blocks for communication between the memory controller 110 and the memory die 200. Each of the input/output blocks may be connected to at least one TSV or at least one TBV and include at least one circuit for processing signals transmitted and received via the connected TSV or TBV. In this example, the memory controller 110 and the memory die 200 transmit and receive data via a plurality of TSVs. Accordingly, the input/output block may be referred to as a "TSV circuit block." However, examples are not limited thereto, and the memory controller 110 and the memory die 200 can transmit and receive data via a plurality of TBVs.

In some implementations, the plurality of input/output blocks or the plurality of TSV circuit blocks may be provided as macros or hard macros and electrically connected to the plurality of TSVs. The hard macros may include various intellectual properties (IPs). The IP may refer to reusable blocks that are provided with layouts and interconnections designed to perform desired electrical functions. Accordingly, the input/output block or TSV circuit block may be referred to as a "TSV macro" or "TSV slice." Hereinafter, the input/output block or TSV circuit block is referred to as a TSV macro.

In some implementations, the interface circuit 120 may include a plurality of input/output blocks, that is, a plurality of TSV macros, and the plurality of TSV macros may include first to fourth TSV macros TM1 to TM4. The first to fourth TSV macros TM1 to TM4 may be selectively arranged according to the types of signals transmitted and received via the connected TSV. The first to fourth TSV macros TM1 to TM4 are described below with reference to FIGS. 6 to 15.

In some implementations, the memory controller 110 of the logic die 100 may operate in a first voltage domain and the memory die 200 may operate in a second voltage domain. In this example, the "voltage domain" may refer to a group of logic elements operating at the same supply voltage level. The power-performance balance of each domain may be optimized by using different voltage levels for the various domains. For example, the memory controller 110 in the first voltage domain may operate at a first voltage level and the memory die 200 in the second voltage domain may operate at a second voltage level. For example, the second voltage level may be higher than the first voltage level.

The interface circuit 120 or each of the TSV macros may change the signal level of each of transmission signals transmitted from the memory controller 110 to the memory die 200, for example, the command CMD, the address ADDR, the data DQ, and/or the clock signal CK, from the first voltage level in the first voltage domain to the second voltage level in the second voltage domain. For example, the interface circuit 120 or each of the TSV macros may increase the voltage level of the transmission signal from the first voltage level to the second voltage level. The interface circuit 120 or each of the TSV macros may change the signal levels of reception signals transmitted from the memory die 200 to the memory controller 110, for example, the data DQ and/or the clock signal CK, from the second voltage level in the second voltage domain to the first voltage level in the first voltage domain.

In some implementations, the memory controller 110 of the logic die 100 may operate in a first clock domain and the memory die 200 may operate in a second clock domain.

Specifically, the internal signals of the logic die 100, that is, the signals transmitted to and received from the memory controller 110 inside the logic die 100, for example, the command CMD, the address ADDR, the data DQ, and/or the clock signal CK, may be synchronized to a controller clock according to the first clock domain. As another example, the internal signals of the memory die 200 (i.e., signals transmitted and received inside the memory die 200), for example, the command CMD, the address ADDR, the data DQ, and/or the clock signal CK, may be synchronized to a memory clock according to the second clock domain.

As described above, the logic to be synchronized between clock crossings has to be provided so as to exchange data or signals between different clock domains. The interface circuit 120 or each TSV macro may synchronize the transmission signal transmitted from the memory controller 110 to the memory die 200 with the memory clock according to the second clock domain and transmit the signal synchronized with the memory clock to the memory die 200. In addition, the interface circuit 120 or each TSV macro may synchronize the reception signal transmitted from the memory die 200 to the memory controller 110 with the controller clock according to the first clock domain and transmit the signal synchronized with the controller clock to the memory controller 110.

In some implementations, the memory controller 110 of the logic die 100 may operate in the first voltage domain and the first clock domain, and the memory die 200 may operate in the second voltage domain and the second clock domain. The interface circuit 120 or each TSV macro may change the signal level of the transmission signal transmitted from the memory controller 110 to the memory die 200 from the first voltage level in the first voltage domain to the second voltage level in the second voltage domain, synchronize the transmission signal with the memory clock according to the second clock domain, and transmit the signal synchronized with the memory clock to the memory die 200. Also, the interface circuit 120 or each TSV macro may change the signal level of the reception signal transmitted from the memory die 200 to the memory controller 110 from the second voltage level in the second voltage domain to the first voltage level in the first voltage domain, synchronize the reception signal to the controller clock according to the first clock domain, and transmit the signal synchronized with the controller clock to the memory controller 110.

In some implementations, each TSV macro may process data and/or signals transmitted and received between the memory controller 110 and the memory die 200 via the corresponding TSV and thus support direct interfacing between the memory controller 110 and the memory die 200 via the TSV. Also, the difficulty in designing a memory interface may be reduced by arranging the plurality of TSV macros as being respectively connected to the plurality of TSVs in an array form. In addition, since the TSV macros are selectively arranged according to data and signals transmitted and received via the TSV, the design freedom of the memory interface may be increased. Furthermore, the number of TSVs corresponding to each TSV macro may change, and thus, the interface circuit 120 may be freely designed according to the size of the logic die 100 or the available area of the interface circuit 120 inside the logic die 100.

The semiconductor device 10 may be configured inside a personal computer (PC), a mobile electronic device, or a data server. The mobile electronic device may be formed as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of Things (IoT) device, an Internet of Everything (IoE) device, or a drone.

The logic die 100 may include or correspond to an application specific integrated circuit (ASIC), a system on chip (SoC), an application processor (AP), a mobile AP, a chipset, etc. Also, the logic die 100 may further include at least one of other components that perform a function as a host, such as a central processing unit (CPU), a graphics processing unit (GPU), a neural processing unit (NPU), an accelerated processing unit (APU), a tensor processing unit (TPU), a field-programmable gate array (FPGA), a massively parallel processor array (MPPA), and a multi-processor system-on-chip (MPSoC).

The memory controller 110 may access the memory die 200 in response to a request from a host and communicate with the host using a variety of protocols. For example, the memory controller 110 may communicate with the host using an interface protocol, such as peripheral component interconnect-express (PCI-E), advanced technology attachment (ATA), serial ATA (SATA), parallel ATA (PATA), and a serial attached SCSI (SAS). In addition, other interface protocols, such as universal serial bus (USB), multi-media card (MMC), enhanced small disk interface (ESDI), and integrated drive electronics (IDE), may be applied to protocols between the host and the memory controller 110.

The memory cell array MCA in each of the plurality of core dies 200_1 to 200_N may include dynamic random access memory (DRAM) cells. In this example, the semiconductor device 10 may be referred to as HBM DRAM or HBM. For example, the memory cell array MCA may include double data rate synchronous dynamic random access memory (DDR SDRAM), low power double data rate (LPDDR) SDRAM, graphics double data rate (GDDR) SDRAM, rambus dynamic random access memory (RDRAM), etc. However, examples are not limited thereto. The memory cell array MCA may include volatile memory, such as static random access memory (SRAM), or non-volatile memory, such as flash memory, magnetic RAM (RAM), ferroelectric RAM (FeRAM), phase change RAM (PRAM), and resistive RAM (ReRAM).

Also, each of the plurality of core dies 200_1 to 200_N may further include peripheral circuits for controlling write and read operations for the memory cell array MCA. In some implementations, each of the plurality of core dies 200_1 to 200_N may further include an arithmetic circuit that performs arithmetic processing using data received from the logic die 100.

Figure 2:
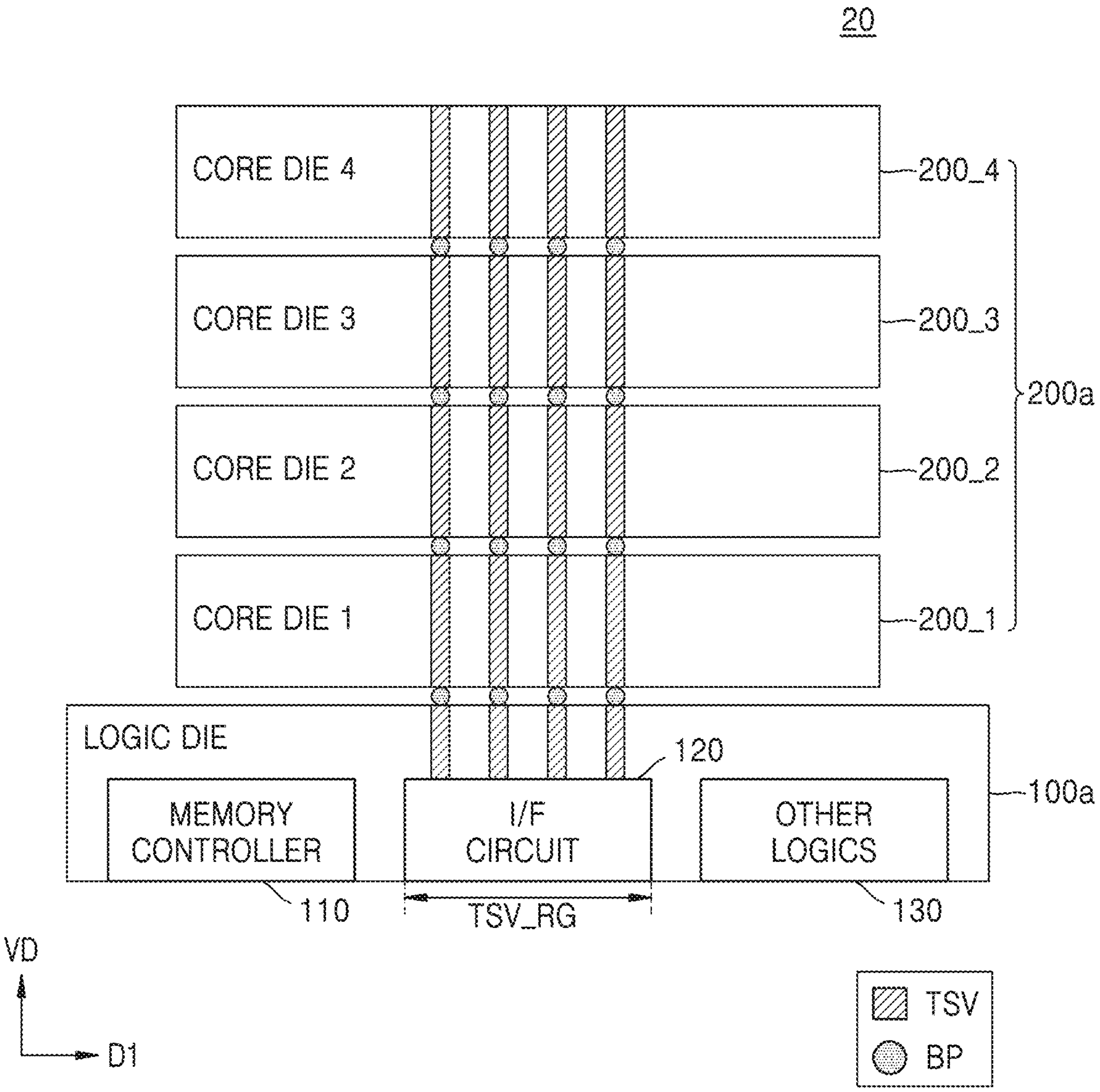
FIG. 2 schematically shows an example of the structure of a semiconductor device.

FIG. 2 schematically shows the structure of an example of a semiconductor device 20.

Referring to FIG. 2, the semiconductor device 20 includes a logic die **100*a* and a memory die 200*a*, and the memory die 200*a* may include first to fourth core dies 200_1 to 200_4 stacked on the logic die 100*a* in a vertical direction VD. In some implementations, the semiconductor device 20 may be referred to as a 3-dimensional (or 3D) memory device or a stacked memory device. For example, the semiconductor device 20 may correspond to a 3-dimensional HBM device. The semiconductor device 20 may correspond to an example of the semiconductor device 10 of FIG. 1, and the descriptions given above with reference to FIG. 1** may also be applied to this example.

The logic die **100*a* and each of the first to fourth core dies 200_1 to 200_4 may include TSVs. The TSVs in the logic die 100*a* may extend through the logic die 100*a* in the vertical direction VD and the TSVs of the first to fourth core dies 200_1 to 200_4 may extend respectively through the first to fourth core dies 200_1 to 200_4 in the vertical direction VD. Bumps BP may be arranged between the logic die 100a and the first to fourth core dies 200_1 to 200_4. For example, the bumps BP may include micro bumps. For example, the bumps BP may include conductive bumps containing copper, cobalt, nickel, etc. The logic die 100a and the first to fourth core dies 200_1 to 200_4** may be electrically connected to each other via the TSVs and bumps BP.

The logic die 100a may further include a memory controller 110 and an interface circuit 120. The TSVs in the logic die 100a may be arranged in a TSV region TSV_RG, and the interface circuit 120 may be arranged so as to be connected to the TSVs in the TSV region TSV_RG. For example, the interface circuit 120 may be disposed below the TSVs in the TSV region TSV_RG, and thus, the interface circuit 120 may be electrically connected to the first to fourth core dies 200_1 to 200_4 via the TSVs.

The interface circuit 120 may include a plurality of TSV macros. Each of the TSV macros may be connected to at least one TSV and process the data or signals transmitted and received via the connected TSV so as to perform input/output operations using the TSV. For example, each TSV macro may change the voltage level of data or signals transmitted via the TSV connected thereto to the voltage level according to the voltage domain of a die to which the data or signals are to be transmitted. For example, each TSV macro may synchronize data or signals transmitted via the TSV connected thereto with a clock according to the clock domain of a die to which the data or signals are to be transmitted, that is, the memory die 200a. For example, each TSV macro may synchronize signals received via the TSV connected thereto with a clock according to the clock domain of a die to which the signals are to be transmitted, that is, the memory controller 110.

The logic die 100a may further include other logics 130. For example, other logics 130 may include a CPU or GPU. For example, other logics 130 may include interface logics. Although FIG. 2 illustrates that the memory controller 110, the interface circuit 120, and other logics 130 are arranged in a first direction D1, examples are not limited thereto. In some implementations, the arrangement of the memory controller 110, the interface circuit 120, and other logics 130 may vary inside the logic die 100a.

In addition, the logic die 100a may further include backside vias, for example, TBVs. For example, the TBVs may be arranged so as to be connected to the interface circuit 120 in the TSV region TSV_RG. Accordingly, the interface circuit 120 may be electrically connected to the first to fourth core dies 200_1 to 200_4 via the TBVs and/or wires connected to the TBVs. In addition, the interface circuit 120 may be electrically connected, via the TBVs, to other components in the logic die 100a, for example, the memory controller 110 and other logics 130 or to an external device.

Figure 3A:
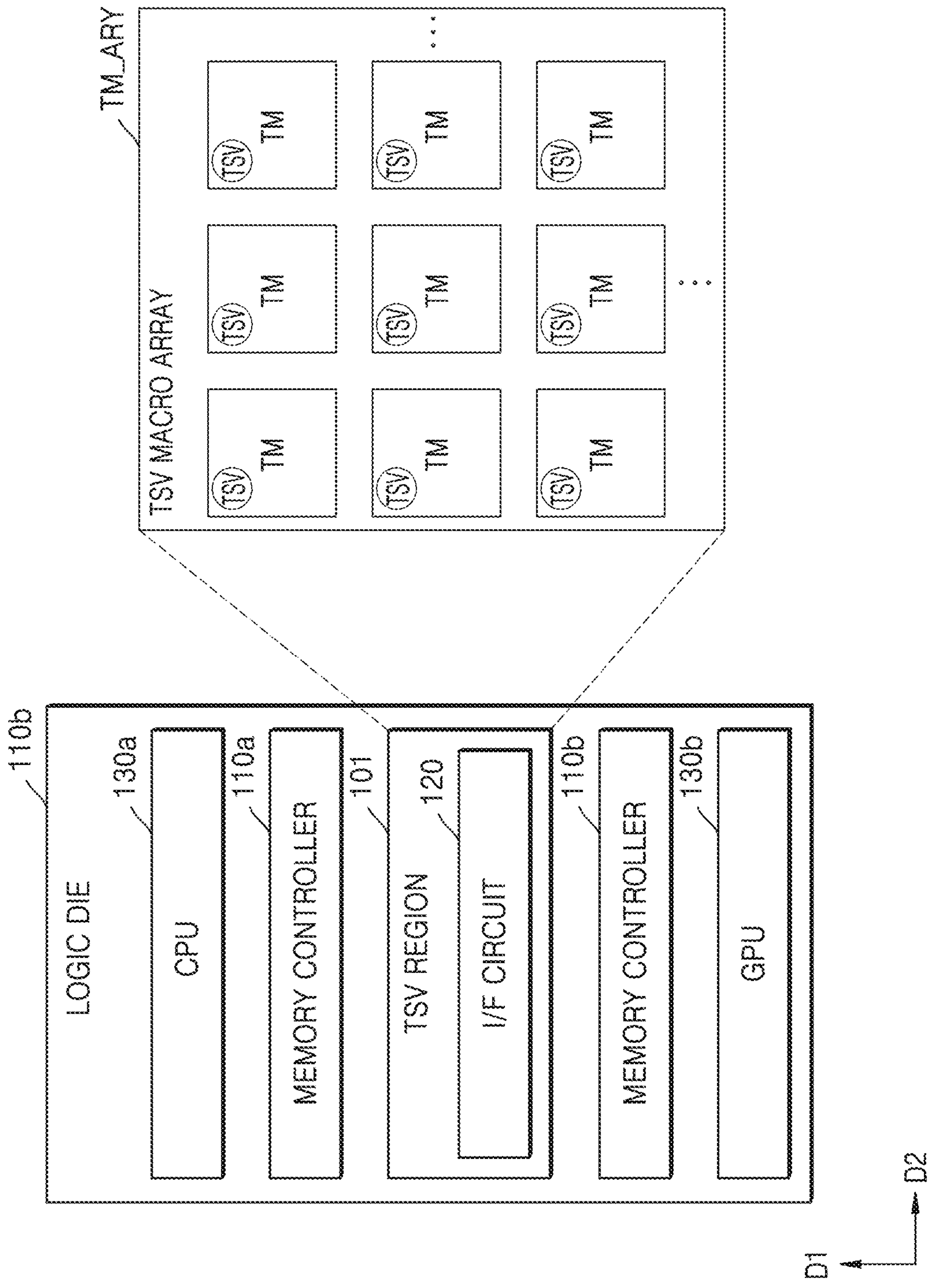
FIGS. 3A and 3B illustrates examples of logic dies.

FIG. 3A illustrates an example of a logic die 100b.

Referring to FIG. 3A, the logic die 100b includes a TSV region 101, memory controllers 110a and 110b, a CPU 130a, and a GPU 130b. In this example, the logic die 100b may correspond to an example of the logic die 100a of FIG. 2, and the TSV region 101 may correspond to the TSV region TSV_RG of FIG. 2. The descriptions given above with reference to FIGS. 1 and 2 may also be applied to this example.

The logic die 100b may further include a plurality of TSVs and an interface circuit 120 located in the TSV region 101, and the interface circuit 120 may include a plurality of TSV macros TM. Each of the TSV macros TM may be connected to at least one TSV. FIG. 3A shows that each TSV macro TM is connected to one TSV, but examples are not limited thereto. For example, TSV macro arrays described below with reference to FIGS. 18A to 19C.

In some implementations, the interface circuit 120 may include a TSV macro array TM_ARY. For example, a plurality of TSVs may be arranged in an array form in a first direction D1 and a second direction D2, and a plurality of TSV macros TM may be arranged in an array form in the first direction D1 and the second direction D2. Accordingly, the plurality of TSV macros TM may form the TSV macro array TM_ARY.

Figure 3B:
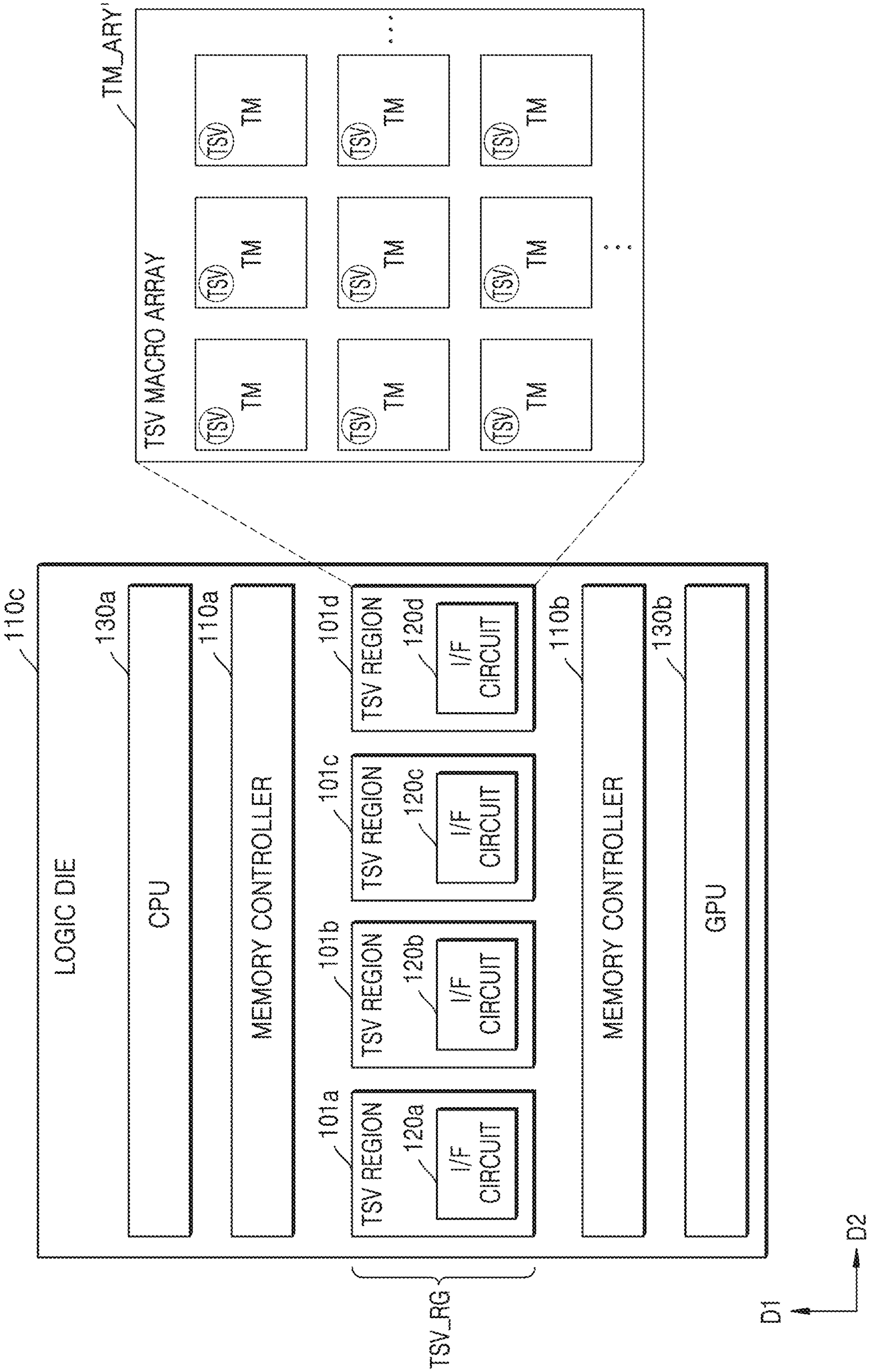

FIG. 3B illustrates an example of a logic die 100c.

Referring to FIG. 3B, the logic die 100c may correspond to a modified example of the logic die 100b of FIG. 3A. The TSV region TSV_RG of the logic die 100c includes first to fourth TSV regions 101a to 101d. A plurality of TSVs and a plurality of TSV macros TM may be arranged in each of the first to fourth TSV regions 101a to 101d. However, examples are not limited thereto, and the TSV region TSV_RG may be divided into five or more TSV regions or divided into less than four TSV regions.

Each of the first to fourth TSV regions 101a to 101d may correspond to a plurality of channels. For example, each of the first to fourth TSV regions 101a to 101d may correspond to four channels. For example, the first TSV region 101a may include an interface circuit 120a corresponding to two channels of the first core die (e.g., 200_1 in FIG. 2) and two channels of the third core die (e.g., 200_3 in FIG. 2). For example, the second TSV region 101b may include an interface circuit 120b corresponding to two channels of the second core die (e.g., 200_2 in FIG. 2) and two channels of the fourth core die (e.g., 200_4 in FIG. 2). For example, the third TSV region 101c may include an interface circuit 120c corresponding to the other two channels of the first core die 200_1 and the other two channels of the third core die 200_3. For example, the fourth TSV region 101d may include an interface circuit 120d corresponding to the other two channels of the second core die 200_2 and the other two channels of the fourth core die 200_4. The interface circuit located in each of the first to fourth TSV regions 101a to 101d may include a TSV macro array. For example, the interface circuit 120d located in the fourth TSV region 101d may include a TSV macro array TM_ARY' in which a plurality of TSV macros TM are arranged in an array form.

Figure 4:
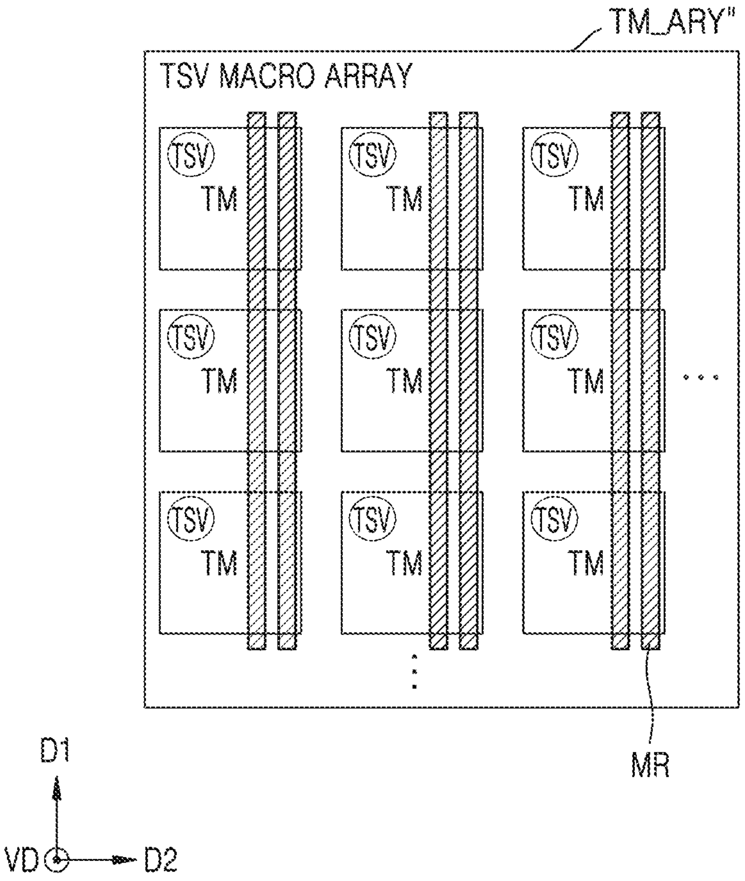
FIG. 4 shows an example of a through silicon via (TSV) macro array.

FIG. 4 shows an example of a TSV macro array TM_ARY".

Referring to FIG. 4, the TSV macro array TM_ARY" may include a plurality of TSV macros TM, and each of TSV macros TM may be connected to a corresponding TSV. The TSV macro array TM_ARY" may be provided in the interface circuit of the logic die. For example, the TSV macro array TM_ARY" may correspond to a modified example of the TSV macro array TM_ARY of FIG. 3A or the TSV macro array TM_ARY' of FIG. 3B.

M metal layers, where M is a natural number greater than 0, may be disposed above the TSV macro array TM_ARY" in a vertical direction VD. In this example, lower metal layers adjacent to a substrate, for example, first to Kth metal layers, may be used as wires, signal wires, and/or power wires for interconnecting elements in the TSV macro array TM_ARY", and some of upper metal layers, for example, (K+1)th to Mth metal layers, may be used as metal wires MR (K is a natural number greater than 0 and less than M). In this example, the metal wires MR may electrically connect components inside the logic die to each other. For example, the metal wires MR may be used as wires for transmitting clock, power, and/or data between the memory controllers 110a and 110b, the CPU 130a, and/or the GPU 130b of FIG. 3A or 3B.

FIG. 4 illustrates that the metal wires MR are disposed above the TSV macro array TM_ARY" in the vertical direction VD, but examples are not limited thereto. In some implementations, the metal wires MR may be arranged adjacent to the TSV macro array TM_ARY" in the horizontal direction. As described above, the metal wires MR may be positioned in various ways regardless of the arrangement of the TSV macro array TM_ARY".

Figure 5A:
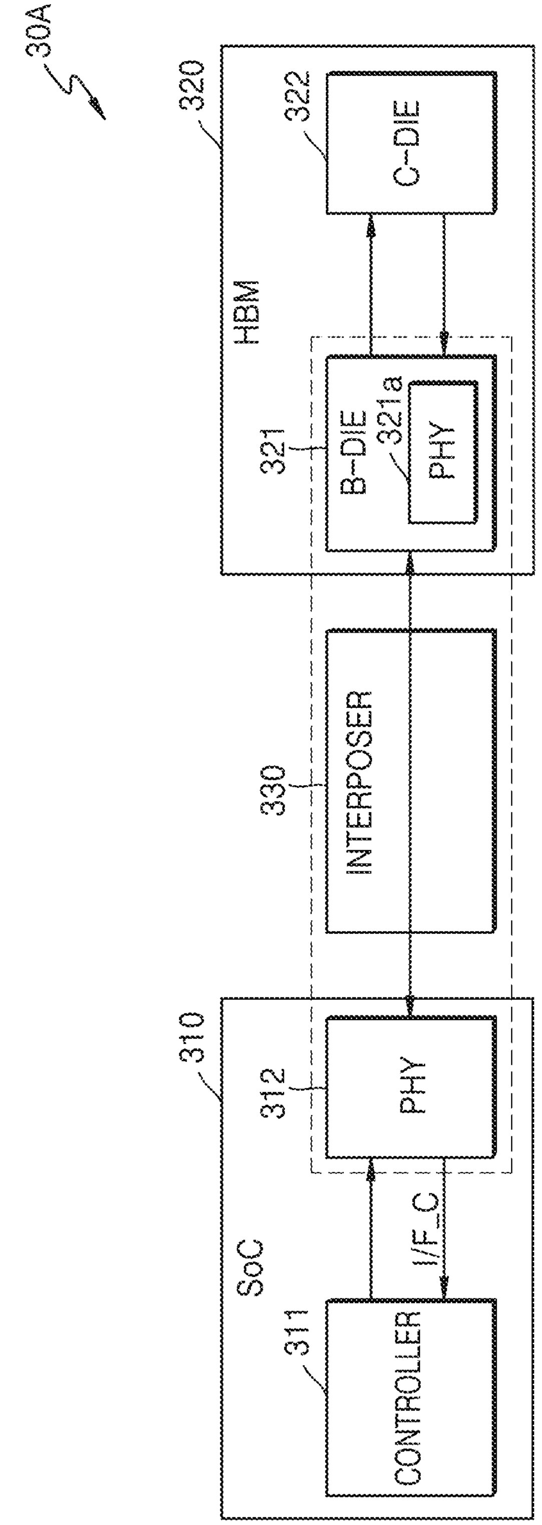
FIG. 5A illustrates an example of a high-bandwidth memory (HBM) system.

FIG. 5A illustrates an example of an HBM system 30A.

Referring to FIG. 5A, the HBM system 30A may include an SoC 310 and an HBM 320, and the HBM 320 may include a base die (or B-DIE) 321 and a plurality of core dies (or C-DIE) 322 arranged on the base die 321. In this example, the SoC 310 and the HBM 320 may be mounted on an interposer 330. The SoC 310 may include a controller 311 and a physical region (or PHY) 312, and the controller 311 and the physical region 312 may communicate commands/addresses and data according to a controller interface I/F_C, such as a DDR PHY Interface (DFI). The physical region 312 may communicate with a physical region 321a provided in the base die 321 of the HBM 320 via the interposer 330. For example, the SoC 310 and the HBM 320 may communicate commands/addresses and data via the interposer 330 on the basis of high-speed communication according to the Joint Electron Device Engineering Council (JEDEC) interface.

Figure 5B:
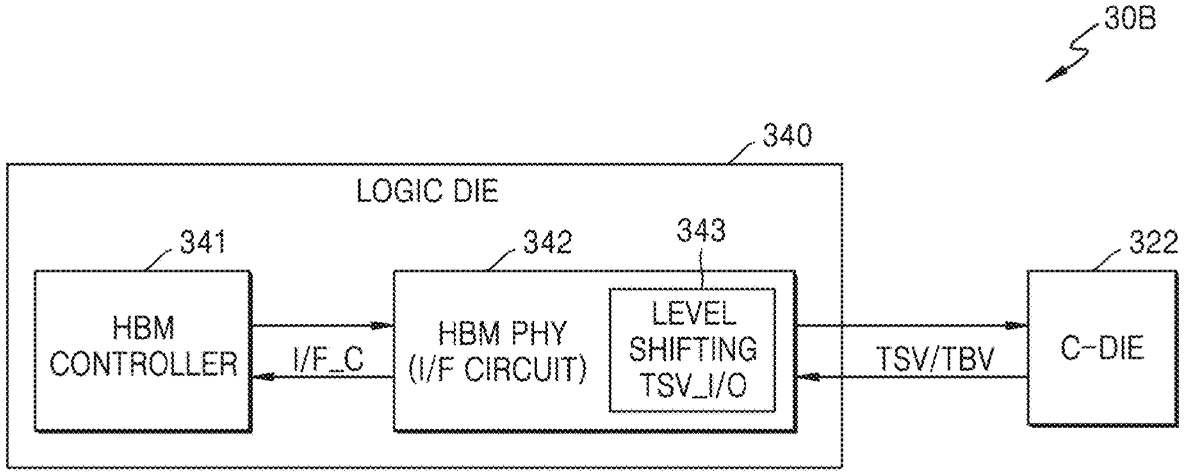
FIG. 5B illustrates an example of an HBM device.

FIG. 5B illustrates an example of an HBM device 30B.

Referring to FIG. 5B, the HBM device 30B may include a logic die 340 and a plurality of core dies 322. For example, the HBM device 30B may correspond to the semiconductor device 10 of FIG. 1 or the semiconductor device 20 of FIG. 2, and the descriptions given above with reference to FIGS. 1 to 4 may be applied to this example.

The logic die 340 may include an HBM controller 341 and an HBM physical region 342. The HBM controller 341 and the HBM physical region 342 may communicate commands/addresses and data according to the controller interface I/F_C, such as DFI. The plurality of core dies 322 may be stacked on the logic die 340, and thus, the HBM physical region 342 may be referred to as a 3D HBM PHY region. The HBM controller 341 may correspond to the memory controller 110 of FIG. 1, and the HBM physical region 342 may correspond to the interface circuit 120 of FIG. 1.

Unlike FIG. 5A, the HBM device 30B may not include the SoC 310, the interposer 330, and the base die 321. The HBM physical region 342 may perform the functions of the physical region 312 of the SoC 310, the interposer 330, and the physical region 321a in the base die 321 of the HBM 320 of FIG. 5A. Therefore, there is no need to perform high-speed communication based on the JEDEC interface via an interposer when transmitting commands/addresses and data from the HBM controller 341 to the plurality of core dies 322.

Accordingly, the HBM physical region 342 of the logic die 340 may include an interface circuit (e.g., interface circuit 120 in FIG. 1), and the interface circuit may support direct interfacing between the HBM controller 341 and the core dies 322 via TSVs and/or TBVs. Specifically, as the HBM physical region 342 of the logic die 340 communicates with the core dies 322 via the TSVs and/or TBVs, the HBM physical region 342 of the logic die 340 may include a TSV input/output (I/O) circuit 343. The TSV I/O circuit 343 may change the voltage level of signals transmitted and received via the TSVs and/or TBVs between the voltage level according to the voltage domain of the logic die 340 and the voltage level according to the voltage domain of the core dies 322. Accordingly, the TSV I/O circuit 343 may be referred to as a level shifting TSV I/O circuit (or level shifting TSV_I/O).

Figure 6:
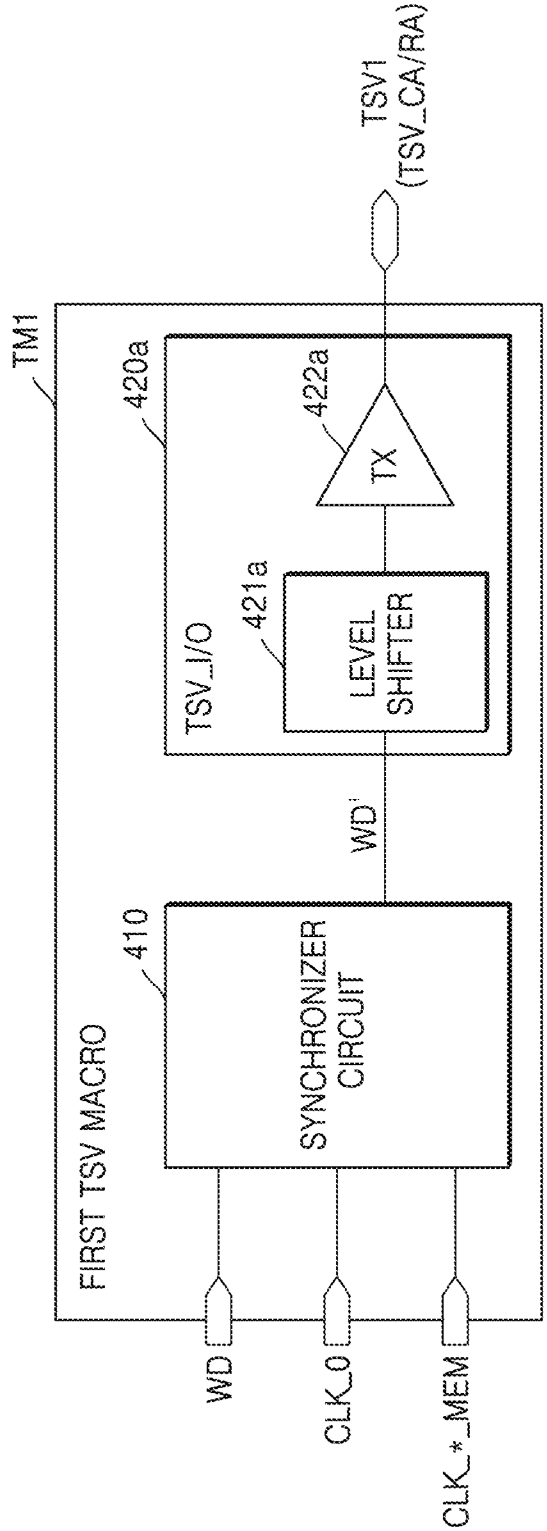
FIG. 6 is a block diagram schematically showing an example of TSV macro.

FIG. 6 is a block diagram schematically showing an example of a first TSV macro TM1.

Referring to FIGS. 1 and 6 together, the first TSV macro TM1 may be connected to a first TSV TSV1, and the first TSV TSV1 may correspond to a TSV through which a signal transmitted from the logic die 100 is delivered to the memory die 200. For example, a signal transmitted from the logic die 100 to the memory die 200 may include column/row address CA/RA. In this example, the first TSV TSV1 may correspond to TSV_CA/RA through which the column/row address CA/RA is transmitted.

The first TSV macro TM1 may receive write data WD, a controller clock CLK_0 according to the first clock domain of the memory controller 110, and a memory clock CLK_*_MEM according to the second clock domain of the memory die 200. The first TSV macro TM1 may perform signal processing on the write data WD in order to transmit the write data WD to the memory die 200 via the first TSV TSV1. In some implementations, the first TSV macro TM1 may include a synchronization circuit 410 and a TSV I/O circuit (or TSV_I/O) 420a.

The synchronization circuit 410 may synchronize the write data WD received from the memory controller 110 with the memory clock CLK_*_MEM according to the second clock domain of the memory die 200 and thus generate a synchronized signal, for example a synchronized write data WD'. The TSV I/O circuit 420a may include a level shifter 421a and a transmitter 422a. The level shifter 421a may change the voltage level of the synchronized signal, for example, the write data WD' synchronized with the memory clock CLK_*_MEM, from the first voltage level in the first voltage domain of the memory controller 110 to the second voltage level in the second voltage domain of the memory die 200. However, examples are not limited thereto, and the TSV I/O circuit 420a may not include the level shifter 421a.

In some implementations, the level shifter 421a may be referred to as a logic level shifter or voltage level translation and defined as a circuit used to translate a signal from one logic level or voltage domain to another logic level or voltage domain. The compatibility between integrated circuits having different voltage requirements is allowed by using the level shifter 421a. The transmitter 422a may output write data having a changed voltage level to the first TSV TSV1.

Figure 7:
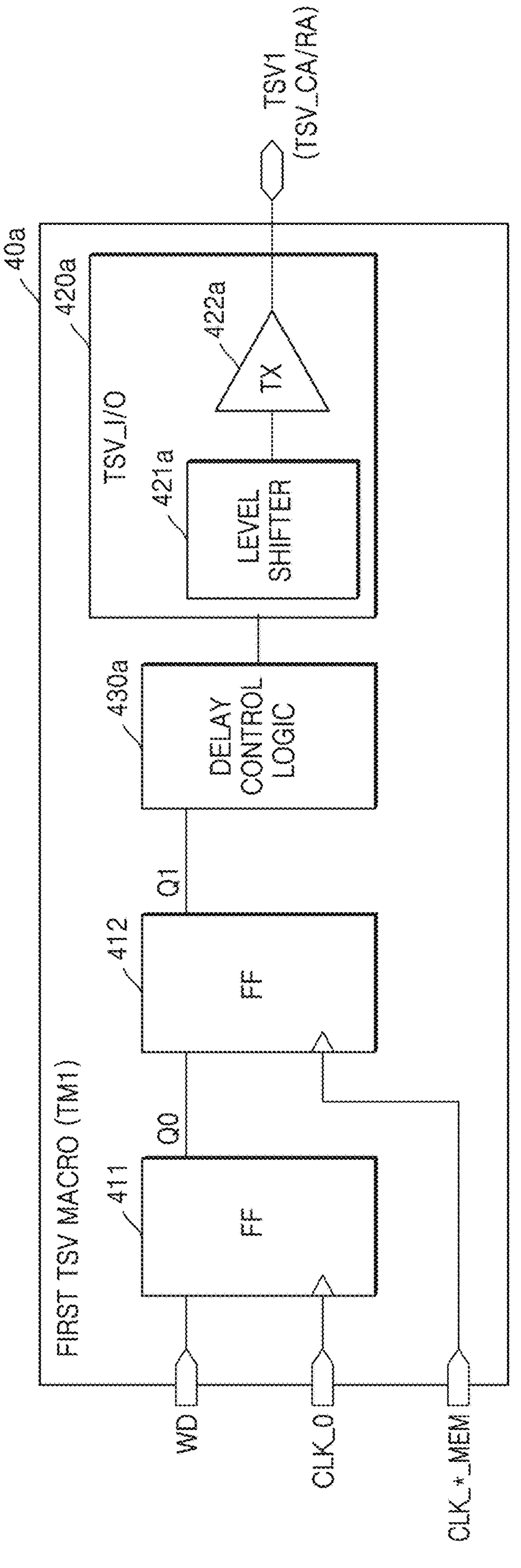
FIG. 7 is a block diagram showing another example TSV macro.
Figure 8A:
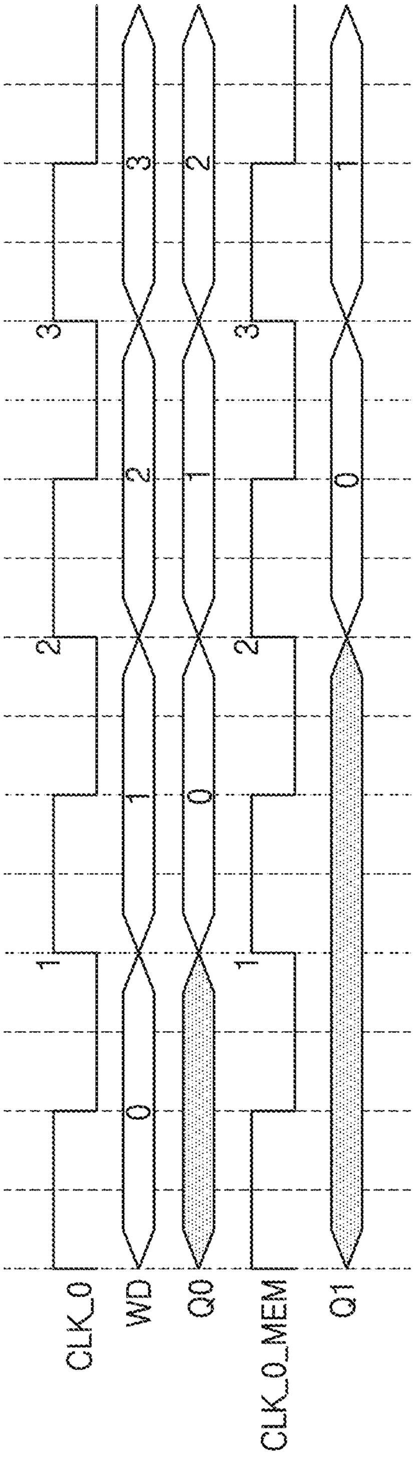
FIGS. 8A to 8D are timing charts illustrating operation of the TSV macro of FIG. 7.
Figure 8B:
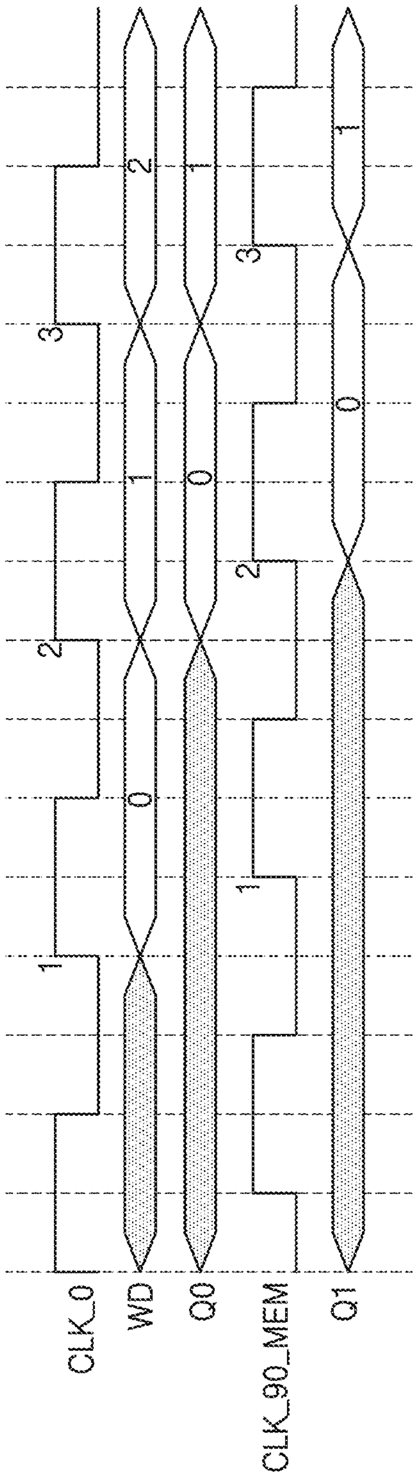
Figure 8C:
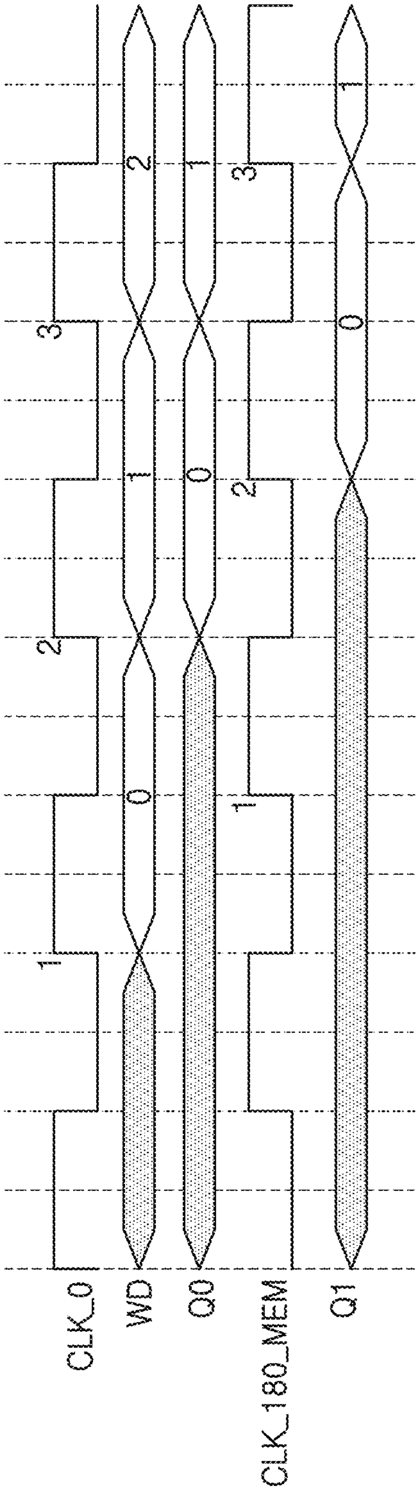
Figure 8D:
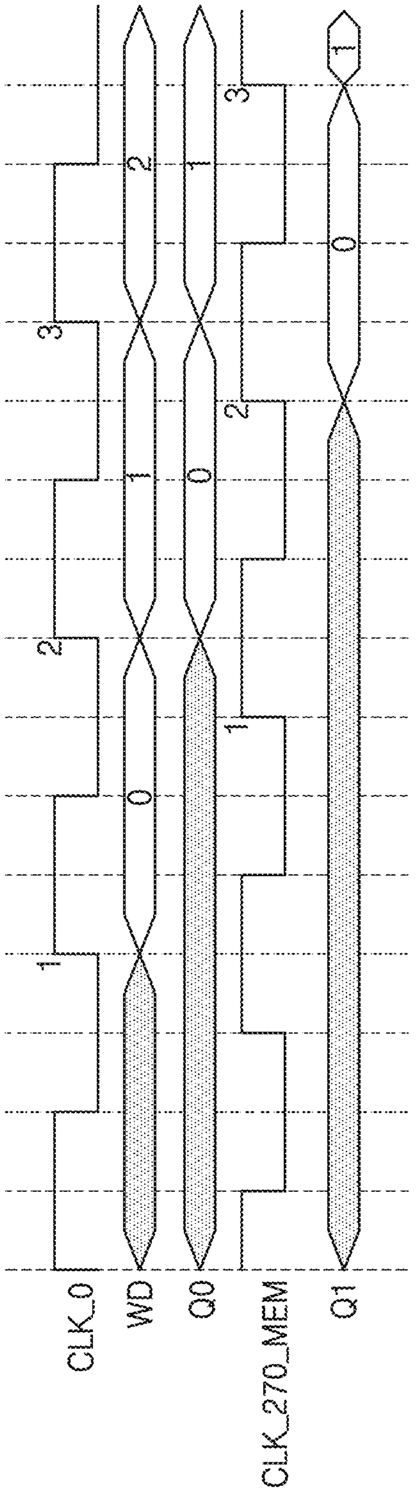

FIG. 7 is a block diagram showing an example of a first TSV macro 40a. FIGS. 8A to 8D are timing charts illustrating the operation of the first TSV macro 40a of FIG. 7.

Referring to FIGS. 1 and 7 to 8D together, the first TSV macro 40a may include flip-flops 411 and 412, a delay control logic 430a, and a TSV I/O circuit 420a. The first TSV macro 40a may correspond to an example of the first TSV macro TM1 of FIG. 6, and the descriptions given above with reference to FIG. 6 may be applied to this example. For example, the flip-flops 411 and 412 may correspond to the synchronization circuit 410 of FIG. 6. For example, the flip-flops 411 and 412 may include D flip-flops. For example, the first TSV TSV1 may correspond to the TSV through which the column/row address CA/RA transmitted from the logic die 100 is delivered to the memory die 200, that is, the TSV_CA/RA.

The flip-flop 411 may receive write data WD from the memory controller 110, receive a controller clock CLK_0 via a clock terminal, and output a first signal Q0. For example, the write data WD received by the flip-flop 411 may correspond to the column/row address CA/RA. The flip-flop 412 may receive the first signal Q0 from the flip-flop 411, receive a memory clock CLK_*_MEM via a clock terminal, and output a second signal Q1. In this example, the flip-flop 412 may output the second signal Q1 by synchronizing the first signal Q0 with the memory clock CLK_*_MEM.

For example, the flip-flop 411 may output the first signal Q0 by latching the write data WD at the rising edge of the controller clock CLK_0. The flip-flop 412 may output the second signal Q1 by latching the first signal Q0 at the rising edge of a memory clock CLK_0_MEM. In this example, the phase difference between the controller clock CLK_0 and the memory clock CLK_*_MEM may vary. For example, in FIG. 8A, the memory clock CLK_0_MEM may have the same phase clock as the controller clock CLK_0. For example, in FIG. 8B, a memory clock CLK_90_MEM may have a phase difference of 90 degrees from the controller clock CLK_0. For example, in FIG. 8C, a memory clock CLK_180_MEM may have a phase difference of 180 degrees from the controller clock CLK_0. For example, in FIG. 8D, a memory clock CLK_270_MEM may have a phase difference of 270 degrees from the controller clock CLK_0.

The delay control logic 430*a* may be located between the flip-flop 412 and the level shifter 421*a* and include at least one delay element. The delay control logic 430*a* may receive the second signal Q1 from the flip-flop 412 and generate a delayed signal by delaying the second signal Q1 for a certain period of time. The delay control logic 430*a* may be configured in various ways, which are described below with reference to FIGS. 16A to 16E. In some implementations, the first TSV macro 40*a* may not include the delay control logic 430*a* and may not include at least one delay element.

The level shifter 421*a* may receive the delayed signal from the delay control logic 430*a* and change the signal level of the delayed signal from a first voltage level in the first voltage domain of the memory controller 110 to a second voltage level in the second voltage domain of the memory die 200*a*. The transmitter 422*a* may transmit an output signal having a changed voltage level to the first TSV TSV1.

Figure 9:
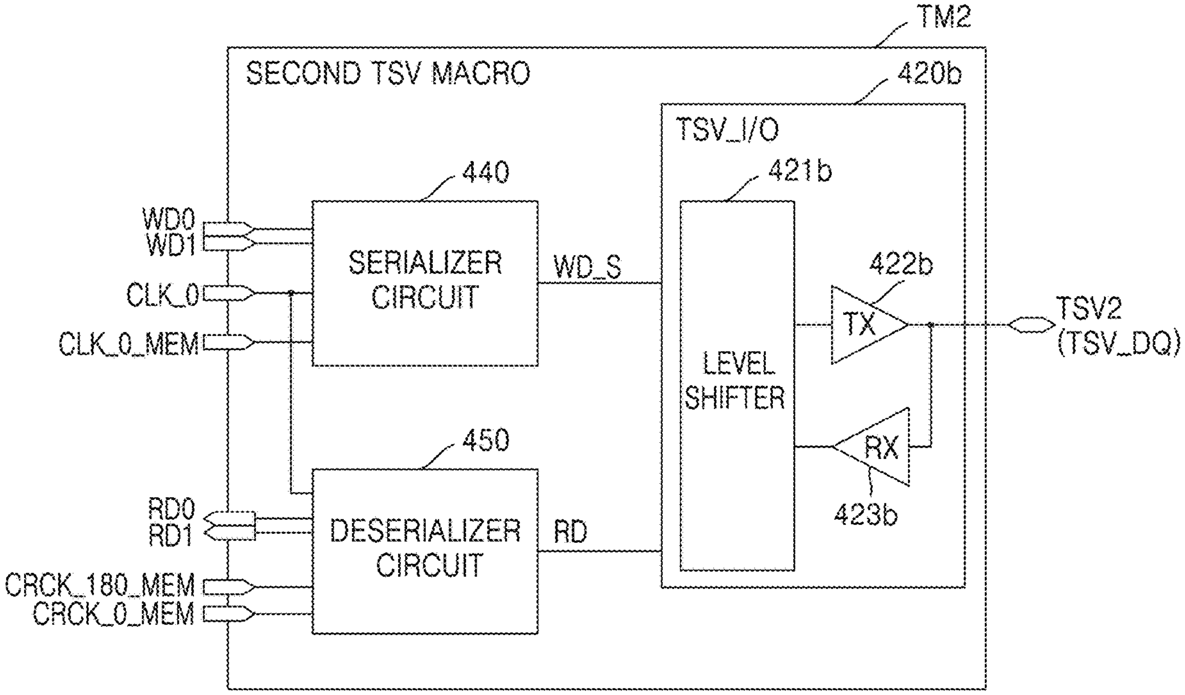
FIG. 9 is a block diagram schematically showing another example of a TSV macro.

FIG. 9 is a block diagram schematically showing a second TSV macro TM2.

Referring to FIGS. 1 and 9 together, the second TSV macro TM2 may be connected to a second TSV TSV2, and the second TSV TSV2 may correspond to a TSV through which the data DQ transmitted and received between the logic die 100 and the memory die 200 is delivered. For example, the data DQ transmitted from the logic die 100 to the memory die 200 may include write data and the data DQ transmitted from the memory die 200 to the logic die 100 may include read data. In this example, the second TSV TSV2 may correspond to TSV_DQ through which the data DQ is transmitted.

The second TSV macro TM2 may be used as a write path for the data DQ and a read path for the data DQ. In some implementations, the second TSV macro TM2 may include a serializer circuit 440, a deserializer circuit 450, and a TSV I/O circuit 420*b*. The TSV I/O circuit 420*b* may include a level shifter 421*b*, a transmitter 422*b*, and a receiver (or RX) 423*b*. However, examples are not limited thereto, and the TSV I/O circuit 420*b* may not include the level shifter 421*a*. When the second TSV macro TM2 is used as a write path for data DQ, the data DQ may be output to the second TSV TSV2 via the serializer circuit 440 and the TSV I/O circuit 420*b*, and the serializer circuit 440 may be referred to as a "write path." When the second TSV macro TM2 is used as a read path for data DQ, the data DQ received via the second TSV TSV2 may be output via the TSV I/O circuit 420*b* and the deserializer circuit 450, and the deserializer circuit 450 may be referred to as a "read path."

When the second TSV macro TM2 is used as the write path for the data DQ, the second TSV macro TM2 may receive first and second write data WD0 and WD1, a controller clock CLK_0 according to the first clock domain of the memory controller 110, and a memory clock CLK_0_MEM according to the second clock domain of the memory die 200 and may output the data DQ. The serializer circuit 440 may synchronize the first and second write data WD0 and WD1 received from the memory controller 110 with the memory clock CLK_0_MEM according to the second clock domain of the memory die 200 and generate serial write data WD_S from data synchronized with the memory clock CLK_0_MEM. The TSV I/O circuit 420*b* may change the voltage level of the serial write data WD_S from the first voltage level in the first voltage domain of the memory controller 110 to the second voltage level in the second voltage domain of the memory die 200 and may output the data DQ that is to be transmitted to the memory die 200.

When the second TSV macro TM2 is used as the read path for the data DQ, the second TSV macro TM2 may receive the data DQ, a controller clock CLK_0 according to the first clock domain of the memory controller 110, and memory read clocks CRCK_0_MEM and CRCK_180_MEM according to the second clock domain of the memory die 200 and may output first and second read data RD0 and RD1. In this example, the memory read clocks CRCK_0_MEM and CRCK_180_MEM may correspond to an output signal of the fourth TSV macro (e.g., fourth TSV macro 40*d* in FIG. 15). The TSV I/O circuit 420*b* (e.g., the receiver 423*b*) may output read data RD from the data DQ received from the memory die 200 via the second TSV TSV2. In one example, the TSV I/O circuit 420*b* may change the voltage level of the data DQ received from the receiver 423*b* from the second voltage level in the second voltage domain of the memory die 200 to the first voltage level in the first voltage domain of the memory controller 110 and may output the read data RD that is to be transmitted to the deserializer circuit 450. The deserializer circuit 450 may deserialize the read data RD on the basis of memory read clocks CRCK_0_MEM and CRCK_180_MEM and may output the first and second read data RD0 and RD1 by synchronizing the deserialized read data with the controller clock CLK_0.

Figure 10:
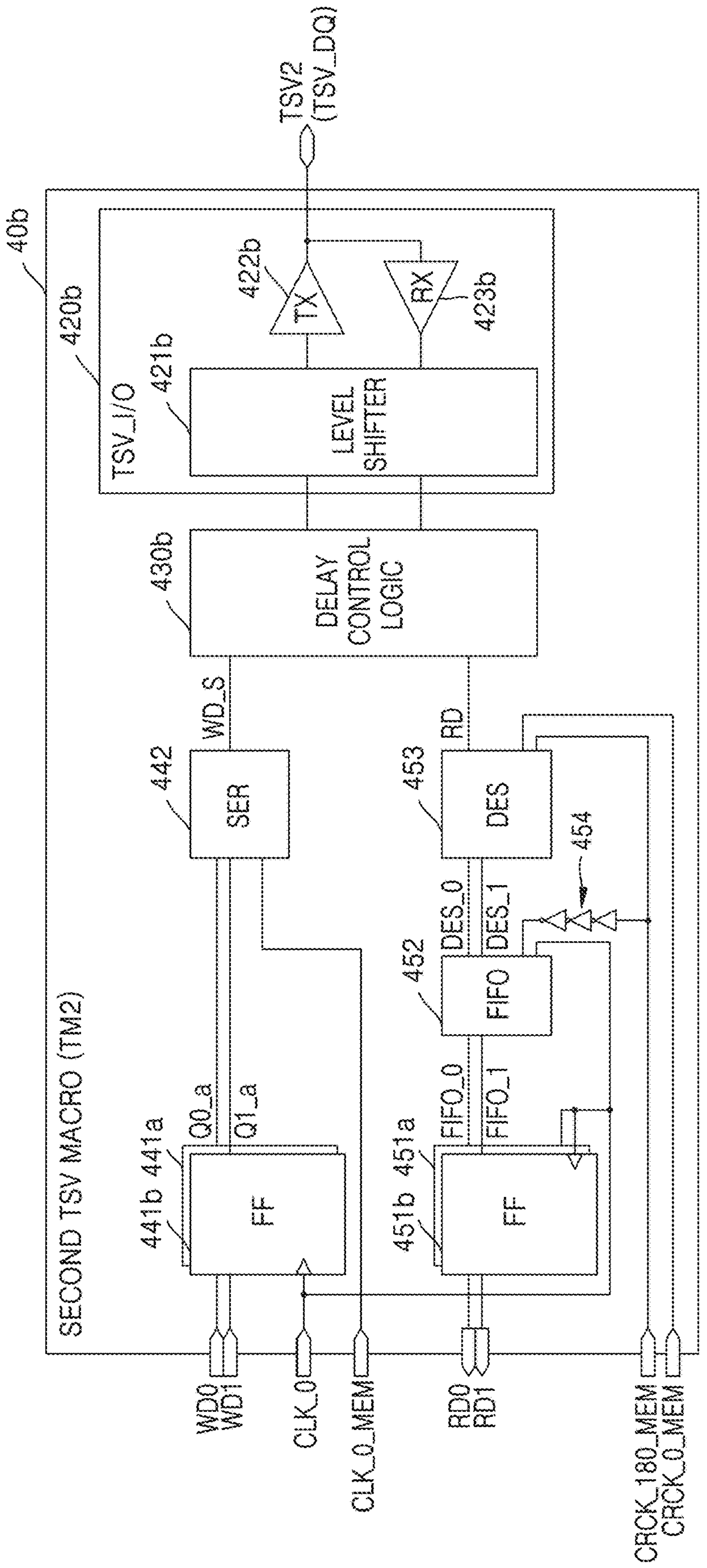
FIG. 10 is a block diagram showing the TSV macro of FIG. 9.
Figure 11A:
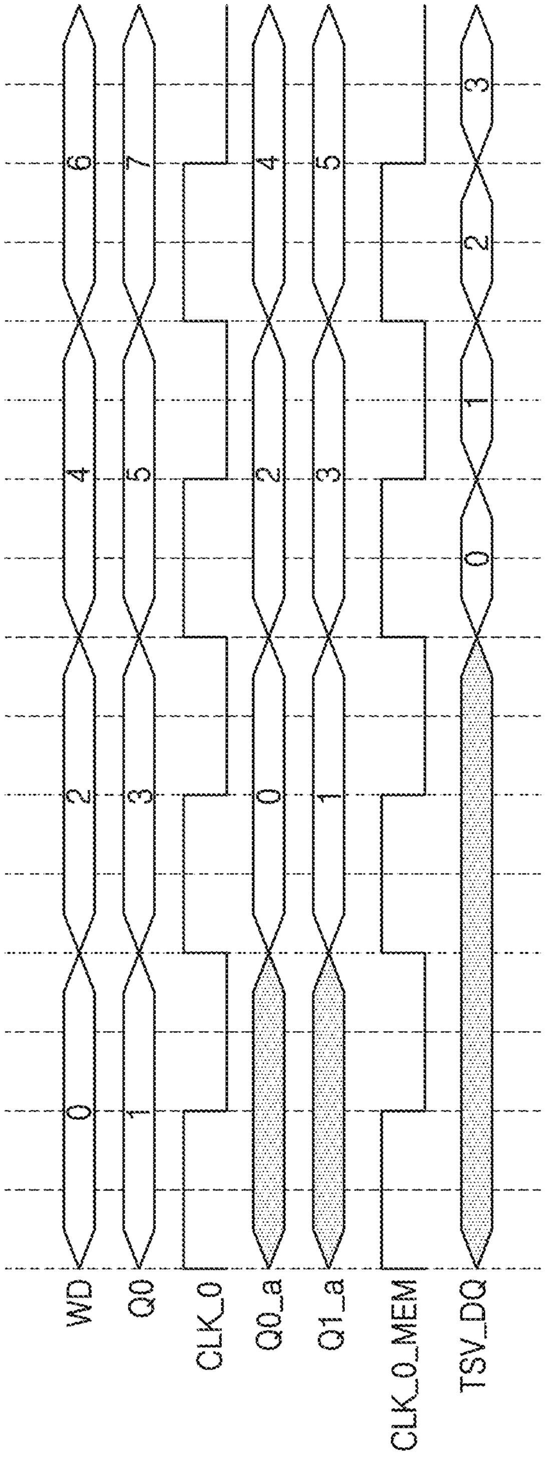
FIG. 11A is a timing chart illustrating operation of the TSV macro of FIG. 10 when the second TSV macro of FIG. 10 is used as a write path.
Figure 11B:
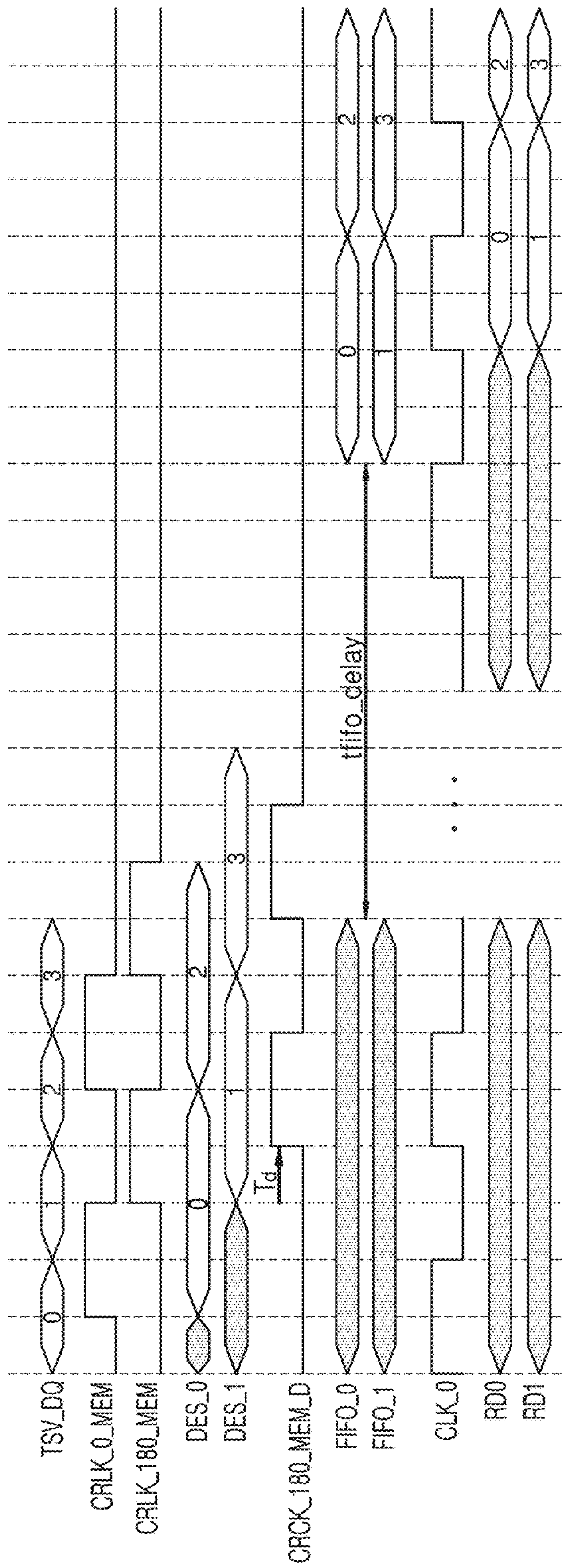
FIG. 11B is a timing chart illustrating operation of the TSV macro of FIG. 10 when the second TSV macro of FIG. 10 is used as a read path.

FIG. 10 is a block diagram showing a second TSV macro 40*b*. FIG. 11A is a timing chart illustrating the operation of the second TSV macro 40*b* of FIG. 10 when the second TSV macro 40*b* of FIG. 10 is used as a write path. FIG. 11B is a timing chart illustrating the operation of the second TSV macro 40*b* of FIG. 10 when the second TSV macro 40*b* of FIG. 10 is used as a read path.

Referring to FIGS. 1 and 10 to 11B together, the second TSV macro 40*b* may include flip-flops 441*a* and 441*b*, a serializer (SER) 442, a delay control logic 430*b*, a TSV I/O circuit 420*b*, flip-flops 451*a* and 451*b*, a first-in-first-out (FIFO) 452, and a deserializer (DES) 453. The second TSV macro 40*b* may correspond to an example of the second TSV macro TM2 of FIG. 9, and the descriptions given above with reference to FIG. 9 may be applied to this example. For example, the flip-flops 441*a* and 441*b* and the SER 442 may correspond to the serializer circuit 440 of FIG. 9. For example, the flip-flops 451*a* and 451*b*, the FIFO 452, and the DES 453 may correspond to the deserializer circuit 450 of FIG. 9. For example, the second TSV TSV2 may correspond to a TSV through which data DQ transmitted and received between the logic die 100 and the memory die 200 is delivered, that is, TSV_DQ.

First, the operation of the second TSV macro 40*b* is described when the second TSV macro 40*b* is used as a write path for data DQ. The flip-flop 441*a* may receive first write data WD0 from the memory controller 110, receive a controller clock CLK_0 via a clock terminal, and output a first signal Q0_*a*. The flip-flop 441*b* may receive second write data WD1 from the memory controller 110, receive the controller clock CLK_0 via a clock terminal, and output a second signal Q1_*a*. For example, the flip-flop 441*a* may output the first signal Q0_*a* by latching the first write data WD0 at the rising edge of the controller clock CLK_0 and the flip-flop 441*b* may output the second signal Q1_*a* by latching the second write data WD1 at the rising edge of the controller clock CLK_0.

The SER 442 may generate serial data WD_S synchronized with the memory clock CLK_0_MEM from the first and second signals Q0_*a* and Q1_*a*. For example, the SER 442 may generate the serial data WD_S by latching the first signal Q0_*a* at the rising edge of the memory clock CLK_0_MEM and latching the second signal Q1_*a* at the falling edge of the memory clock CLK_0_MEM. The delay control logic 430*b* may receive the serial data WD_S from the SER 442, delay the serial data WD_S for a certain period of time, and generate the delayed serial data. In some implementations, the second TSV macro 40*b* may not include the delay control logic 430*b* and may not include at least one delay element.

The level shifter 421*b* may receive the delayed serial data from the delay control logic 430*b* and change the signal level of the delayed serial data from a first voltage level in the first voltage domain of the memory controller 110 to a second voltage level in the second voltage domain of the memory die 200. The transmitter 422*b* may be connected to the level shifter 421*b* and may transmit the data DQ to the second TSV TSV2.

Next, the operation of the second TSV macro 40*b* is described when the second TSV macro 40*b* is used as a read path for data DQ. The TSV I/O circuit 420*b* (e.g., the receiver 423*b*) may receive data DQ via the second TSV TSV2. In one example, the level shifter 421*b* may change the signal level of the data received from receiver 423*b* from the second voltage level in the second voltage domain of the memory die 200 to the first voltage level in the first voltage domain of the memory controller 110 so as to output the data DQ. The delay control logic 430*b* may output read data RD by delaying the data for a certain period of time. The DES 453 may generate first and second data DES_0 and DES_1 in parallel from the read data RD on the basis of memory read clocks CRCK_0_MEM and CRCK_180_MEM. For example, the DES 453 may generate the first data DES_0 by latching the read data RD at the rising edge of the memory read clock CRCK_0_MEM and generate the second data DES_1 by latching the read data RD at the rising edge of the memory read clock CRCK_180_MEM.

The second TSV macro 40*b* may further include an inverter chain 454 in which a plurality of inverters are connected to each other in series. The inverter chain 454 may delay the memory read clock CRCK_180_MEM by a delay time (Td) and output the delayed memory read clock CRCK_180_MEM_D. The FIFO 452 may output the first and second data FIFO_0 and FIFO_1 by buffering the first and second data DES_0 and DES_1 on the basis of the delayed memory read clock CRCK_180_MEM_D. For example, the FIFO 452 may output the first and second data FIFO_0 and FIFO_1 after a certain period of time (tfifo_delay), and thus, the read data may be output without loss of clock cycles.

The flip-flop 451*a* may receive the first data FIFO_0 from the FIFO 452 and receive the controller clock CLK_0 via a clock terminal. The flip-flop 451*b* may receive the second data FIFO_1 from the FIFO 452 and receive the controller clock CLK_0 via a clock terminal. For example, the flip-flop 451*a* may output first read data RD0 by latching the first data FIFO_0 at the rising edge of the controller clock CLK_0 and the flip-flop 451*b* may output second read data RD1 by latching the second data FIFO_1 at the rising edge of the controller clock CLK_0.

Figure 12:
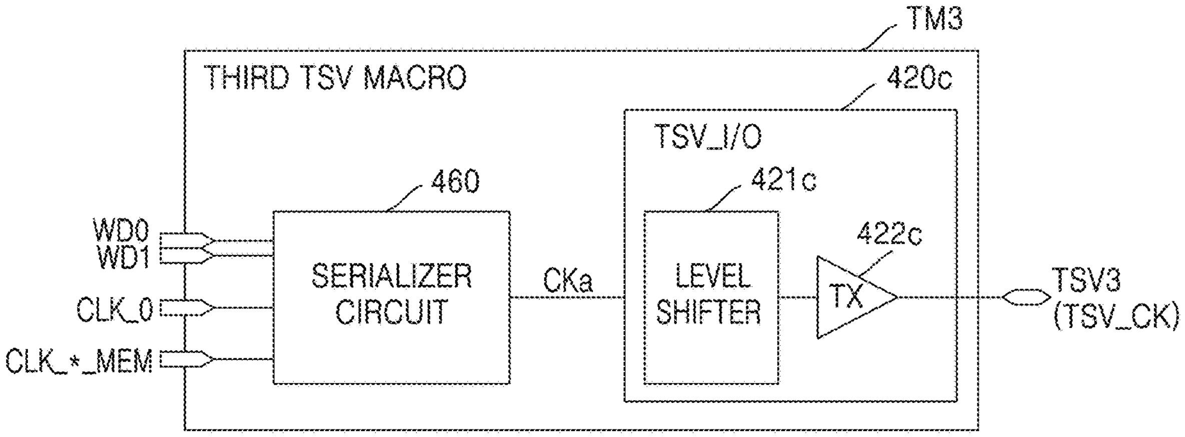
FIG. 12 is a block diagram schematically showing another example of a TSV macro.

FIG. 12 is a block diagram schematically showing a third TSV macro TM3.

Referring to FIGS. 1 and 12 together, the third TSV macro TM3 may be connected to a third TSV TSV3, and the third TSV TSV3 may correspond to a TSV through which a signal transmitted from the logic die 100 is delivered to the memory die 200. For example, a signal transmitted from the logic die 100 to the memory die 200 may include a clock signal CK. In this example, the third TSV TSV3 may correspond to TSV_CK through which the clock signal CK is transmitted.

The third TSV macro TM3 may receive first and second write data WD0 and WD1, a controller clock CLK_0 according to the first clock domain of the memory controller 110, and a memory clock CLK_*_MEM according to the second clock domain of the memory die 200. For example, the first and second write data WD0 and WD1 may include a data pattern for generating the clock signal CK. In this example, the third TSV macro TM3 may generate the clock signal CK. In some implementations, the third TSV macro TM3 may include a serializer circuit 460 and a TSV I/O circuit 420*c*, and the TSV I/O circuit 420*c* may include a level shifter 421*c* and a transmitter 422*c*. However, examples are not limited thereto, and the TSV I/O circuit 420*c* may not include the level shifter 421*a*.

The serializer circuit 460 may generate a clock signal CKa from the first and second write data WD0 and WD1 received in parallel from the memory controller 110 on the basis of the memory clock CLK_*_MEM according to the second clock domain of the memory die 200. The level shifter 421*c* may change the voltage level of the clock signal CKa from a first voltage level in the first voltage domain of the memory controller 110 to a second voltage level in the second voltage domain of the memory die 200. The transmitter 422*c* may output the clock signal having a changed voltage level to the third TSV TSV3.

Figure 13:
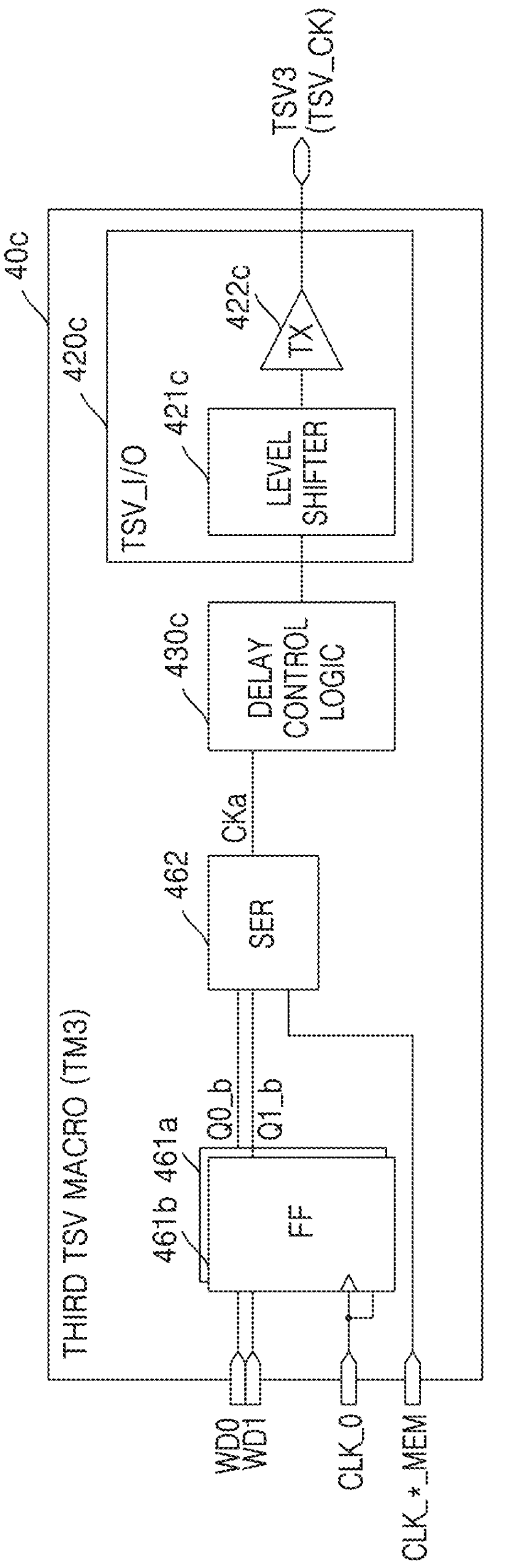
FIG. 13 is a block diagram showing the TSV macro of FIG. 12.
Figure 14A:
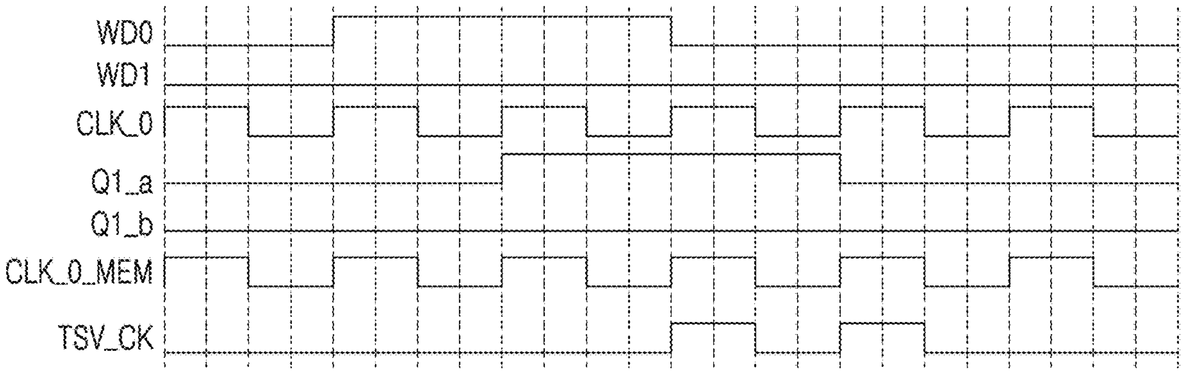
FIGS. 14A to 14D are timing charts illustrating an example of operation of the TSV macro of FIG. 13.
Figure 14B:
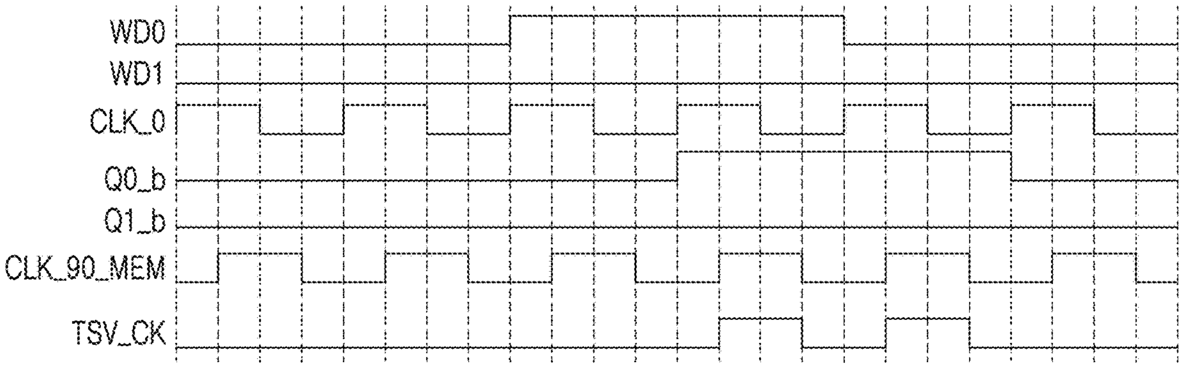
Figure 14C:
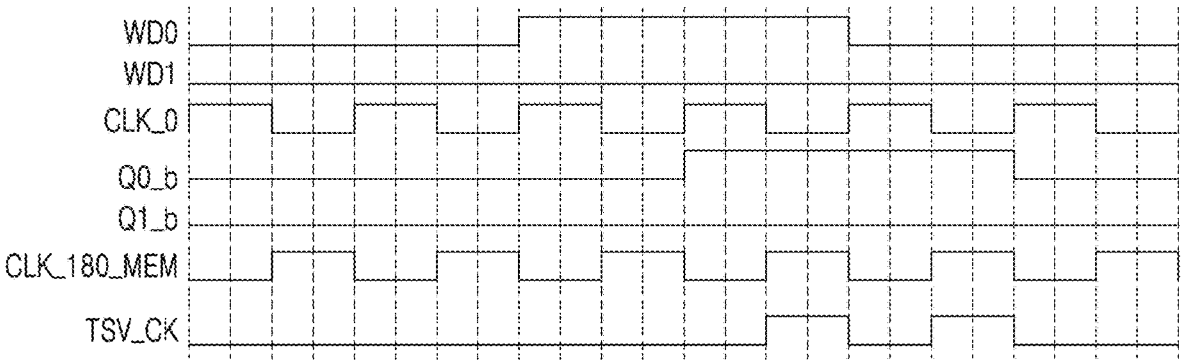
Figure 14D:
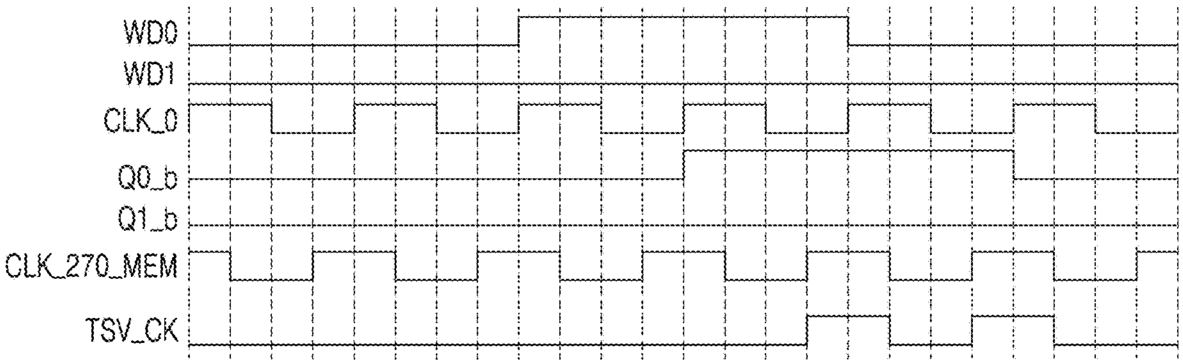

FIG. 13 is a block diagram showing a third TSV macro 40*c*. FIGS. 14A to 14D are timing charts illustrating an example of the operation of the third TSV macro 40*c* of FIG. 13.

Referring to FIGS. 1 and 13 to 14D together, the third TSV macro 40*c* may include flip-flops 461*a* and 461*b*, a SER 462, a delay control logic 430*c*, and a TSV I/O circuit 420*c*. The third TSV macro 40*c* may correspond to an example of the third TSV macro TM3 of FIG. 12, and the descriptions given above with reference to FIG. 12 may be applied to this example. For example, the flip-flops 461*a* and 461*b* and the SER 462 may correspond to the serializer circuit 460 of FIG. 12. For example, the third TSV TSV3 may correspond to the TSV through which the clock signal CK transmitted from the logic die 100 is delivered to the memory die 200, e.g., TSV TSV_CK.

The flip-flop 461*a* may receive first write data WD0 from the memory controller 110, receive a controller clock CLK_0 via a clock terminal, and output a first signal Q0_*b*. The flip-flop 461*b* may receive second write data WD1 from the memory controller 110, receive the controller clock CLK_0 via a clock terminal, and output a second signal Q1_*b*. For example, the first write data WD0 received by the flip-flop 461*a* may include a data pattern having a logic high level for a certain period, and the second write data WD1 received by the flip-flop 461*b* may include a data pattern having a logic low level. For example, the flip-flop 461*a* may output the first signal Q0_*b* by latching the first write data WD0 at the rising edge of the controller clock CLK_0. The flip-flop 461*b* may output the second signal Q1_*b* by latching the second write data WD1 at the rising edge of the controller clock CLK_0.

The SER 462 may generate the clock signal CKa synchronized with a memory clock CLK_*_MEM from the first and second signals Q0_*b* and Q1_*b*. For example, the SER 462 may generate the clock signal CKa by latching the first signal Q0_*b* at the rising edge of the memory clock CLK_*_MEM and latching the second signal Q1_*b* at the falling edge of the memory clock CLK_*_MEM. The delay control logic 430*c* may receive the clock signal CKa from the SER 462 and delay the clock signal CKa for a certain period of time. In some implementations, the third TSV macro 40*c* may not include the delay control logic 430*c* and may not include at least one delay element.

In this example, the phase difference between the controller clock CLK_0 and the memory clock CLK_*_MEM may vary. For example, in FIG. 14A, the memory clock CLK_0_MEM may have the same phase clock as the controller clock CLK_0. For example, in FIG. 14B, a memory clock CLK_90_MEM may have a phase difference of 90 degrees from the controller clock CLK_0. For example, in FIG. 14C, a memory clock CLK_180_MEM may have a phase difference of 180 degrees from the controller clock CLK_0. For example, in FIG. 14D, a memory clock CLK_270_MEM may have a phase difference of 270 degrees from the controller clock CLK_0.

The level shifter 421*c* may change the voltage level of the clock signal, which is received from the delay control logic 430*c*, from a first voltage level in the first voltage domain of the memory controller 110 to a second voltage level in the second voltage domain of the memory die 200*a*. The transmitter 422*c* may output the clock signal CK having a changed voltage level to the third TSV TSV3. For example, the clock signal CK transmitted via the third TSV TSV3 may include a memory clock CLK_MEM, a memory write clock WCK, and/or a memory read clock BRCK. For example, the memory clock CLK_MEM may include a clock signal that always toggles, and the memory write clock WCK and the memory read clock BRCK may include a clock signal that toggles only in a specific period. For example, the memory write clock WCK may include a clock signal that toggles only in a write period, and the memory read clock BRCK may include a clock signal that toggles in a read period.

Figure 15:
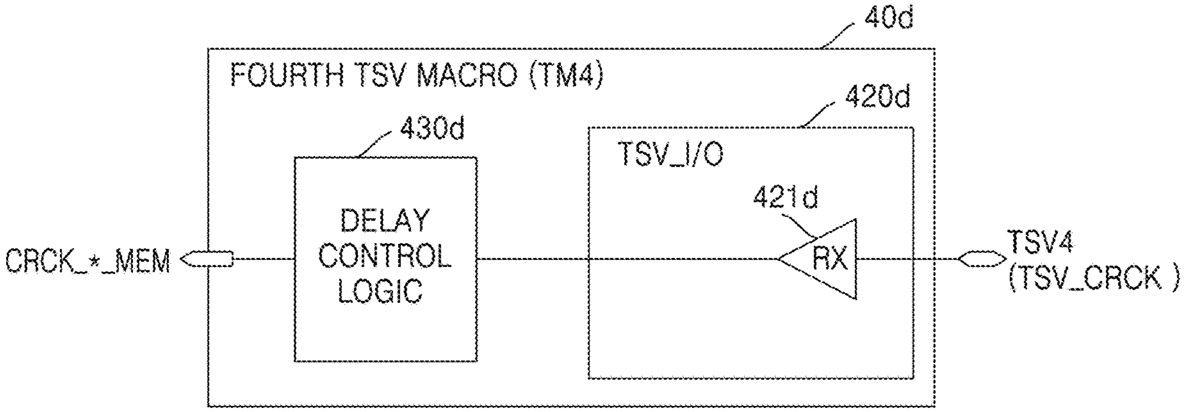
FIG. 15 is a block diagram showing another example of a TSV macro.

FIG. 15 is a block diagram showing a fourth TSV macro 40*d*.

Referring to FIGS. 1 and 15 together, the fourth TSV macro 40*d* may be connected to a fourth TSV TSV4, and the fourth TSV TSV4 may correspond to a TSV through which a signal transmitted from the memory die 200 is delivered to the logic die 100. For example, the signal transmitted from the memory die 200 to the logic die 100 may include a read clock signal CRCK. For example, the read clock signal CRCK may correspond to a clock signal used during a read operation in the memory die 200. In this example, the fourth TSV TSV4 may correspond to TSV_CRCK through which the read clock signal CRCK is transmitted.

In some implementations, the fourth TSV macro 40*d* may include a TSV I/O circuit 420*d* and a delay control logic 430*d*, and the TSV I/O circuit 420*d* may include a receiver 421*d*. The receiver 421*d* may receive the read clock signal CRCK via the fourth TSV TSV4. The delay control logic 430*d* may output a memory read clock signal CRCK_*_MEM by delaying the read clock signal CRCK for a certain period of time. For example, the memory read clock signal CRCK_*_MEM may be applied to the second TSV macro TM2 (e.g., 40*b* in FIG. 10).

FIGS. 16A to 16E each show an example of delay control logic.

Figure 16A:
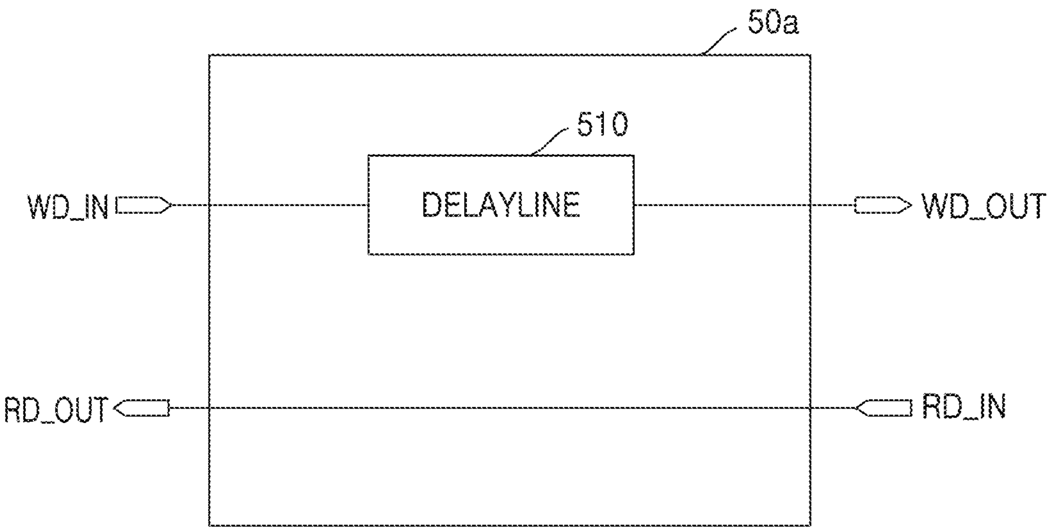
FIGS. 16A to 16E each show an example of a delay control logic.

Referring to FIG. 16A, a delay control logic 50*a* may include a delay line 510 only in a write path. In some implementations, the delay line 510 may include a plurality of delay elements, for example, a plurality of NOT-AND (NAND) gates. The delay control logic 50*a* may generate an output signal WD_OUT by delaying, for a certain period of time, a signal WD_IN received via the write path. The delay control logic 50*a* may transmit a signal RD_IN received via a read path as an output signal RD_OUT without delay. For example, the delay control logic 430*a* of the first TSV macro TM1 or 40*a* and/or the delay control logic 430*c* of the third TSV macro TM3 or 40*c* may be provided as the delay control logic 50*a*, but examples are not limited thereto.

Figure 16B:
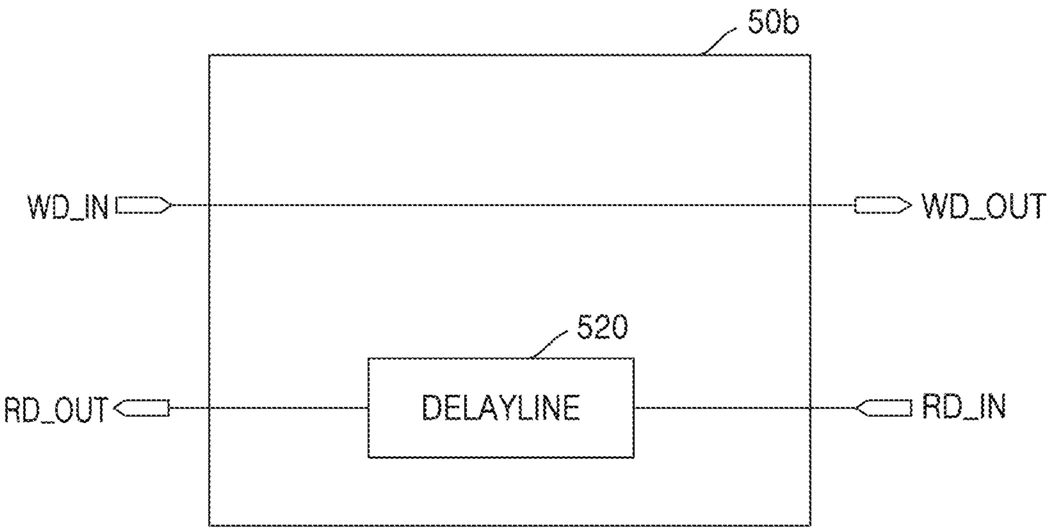

Referring to FIG. 16B, the delay control logic 50*b* may include a delay line 520 only in a read path. In some implementations, the delay line 520 may include a plurality of delay elements, for example, a plurality of NAND gates. The delay control logic 50*b* may generate an output signal RD_OUT by delaying, for a certain period of time, a signal RD_IN received via the read path. The delay control logic 50*b* may transmit a signal WD_IN received via a write path as an output signal WD_OUT without delay. For example, the delay control logic 430*d* of the fourth TSV macro TM4 or 40*d* may be provided as the delay control logic 50*b*, but examples are not limited thereto.

Figure 16C:
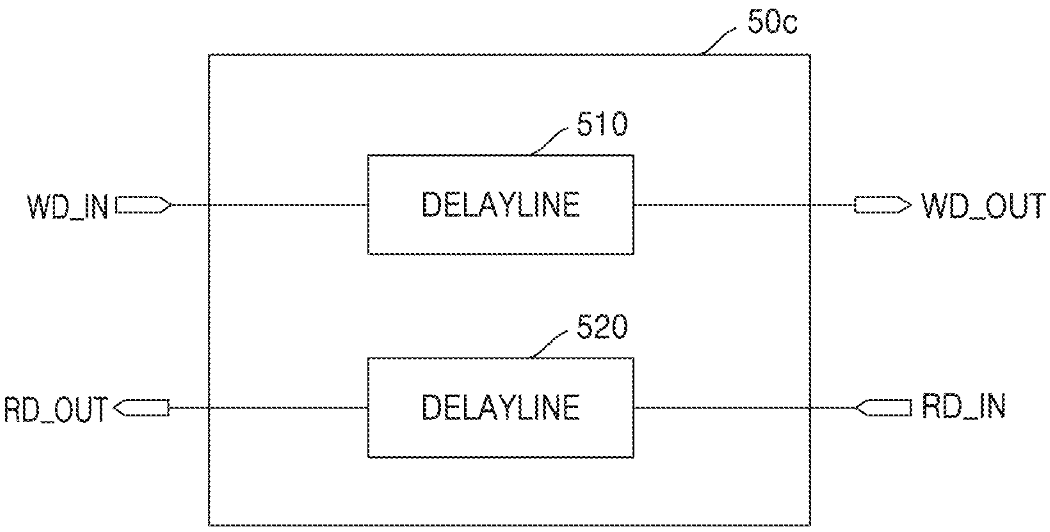

Referring to FIG. 16C, a delay control logic 50*c* may include a delay line 510 in a write path and a delay line 520 in a read path. The delay control logic 50*c* may generate an output signal WD_OUT by delaying, for a certain period of time, a signal WD_IN received via the write path. The delay control logic 50*c* may generate an output signal RD_OUT by delaying, for a certain period of time, a signal RD_IN received via the read path. For example, the delay control logic 430*b* of the second TSV macro TM2 or 40*b* may be provided as the delay control logic 50*c*, but examples are not limited thereto.

Figure 16D:
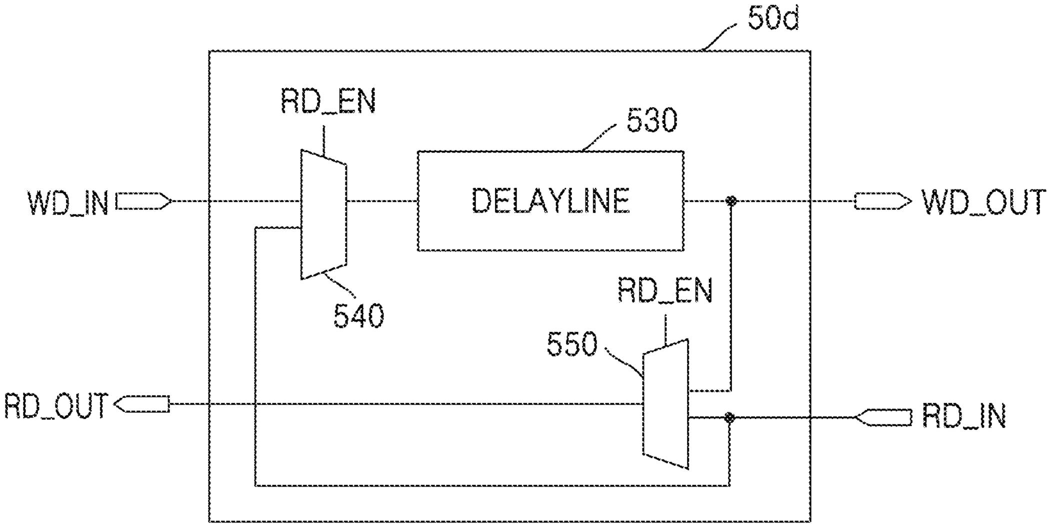

Referring to FIG. 16D, the delay control logic 50*d* may include a delay line 530 and selectors 540 and 550, and the delay line 530 may be used for both a write path and a read path. The selectors 540 and 550 may perform a selection operation on input signals according to a read enable signal RD_EN activated in the read path. For example, each of the selectors 540 and 550 may include a multiplexer.

For example, the read enable signal RD_EN may have a logic low level during a write operation, and the selector 540 may select a signal WD_IN received via the write path. The delay line 530 may generate an output signal WD_OUT by delaying, for a certain period of time, the signal WD_IN output from the selector 540. For example, the read enable signal RD_EN may have a logic high level during a read operation, and the selector 540 may select the signal RD_IN received via the read path. The delay line 530 may delay the signal RD_IN output from the selector 540 for a certain period of time, and the selector 550 may select and provide the output of the delay line 530 as the output signal RD_OUT. For example, the delay control logic 430*b* of the second TSV macro TM2 or 40*b* may be provided as the delay control logic 50*d*, but examples are not limited thereto.

Figure 16E:
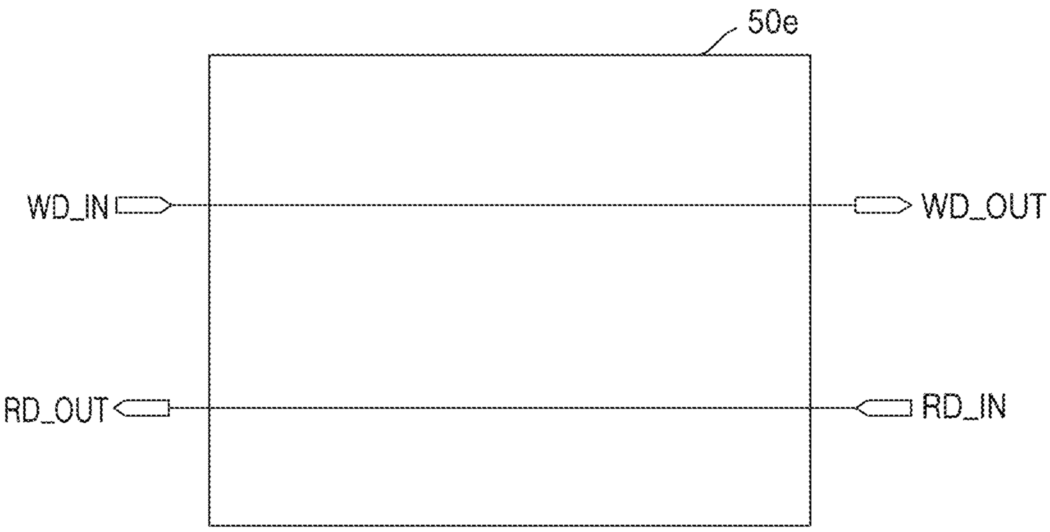

Referring to FIG. 16E, in some implementations, the delay control logic 50*e* may not use a delay line for a write path and a read path. The delay control logic 50*e* may transmit a signal WD_IN received via the write path as an output signal WD_OUT without delay. Also, the delay control logic 50*e* may transmit a signal RD_IN received via the read path as an output signal RD_OUT without delay.

As described above with reference to FIGS. 16A to 16E, the delay control logic may be provided as various forms. For example, the delay control logic may be provided as one of the delay control logics 50*a* to 50*e*, depending on the size of the logic die, the available area of the TSV region, the complexity of the TSV macro logic, or the size of the space between TSVs. For example, the delay control logic 430*b* of FIG. 10 may be provided as the delay control logic 50*e*.

Figure 17:
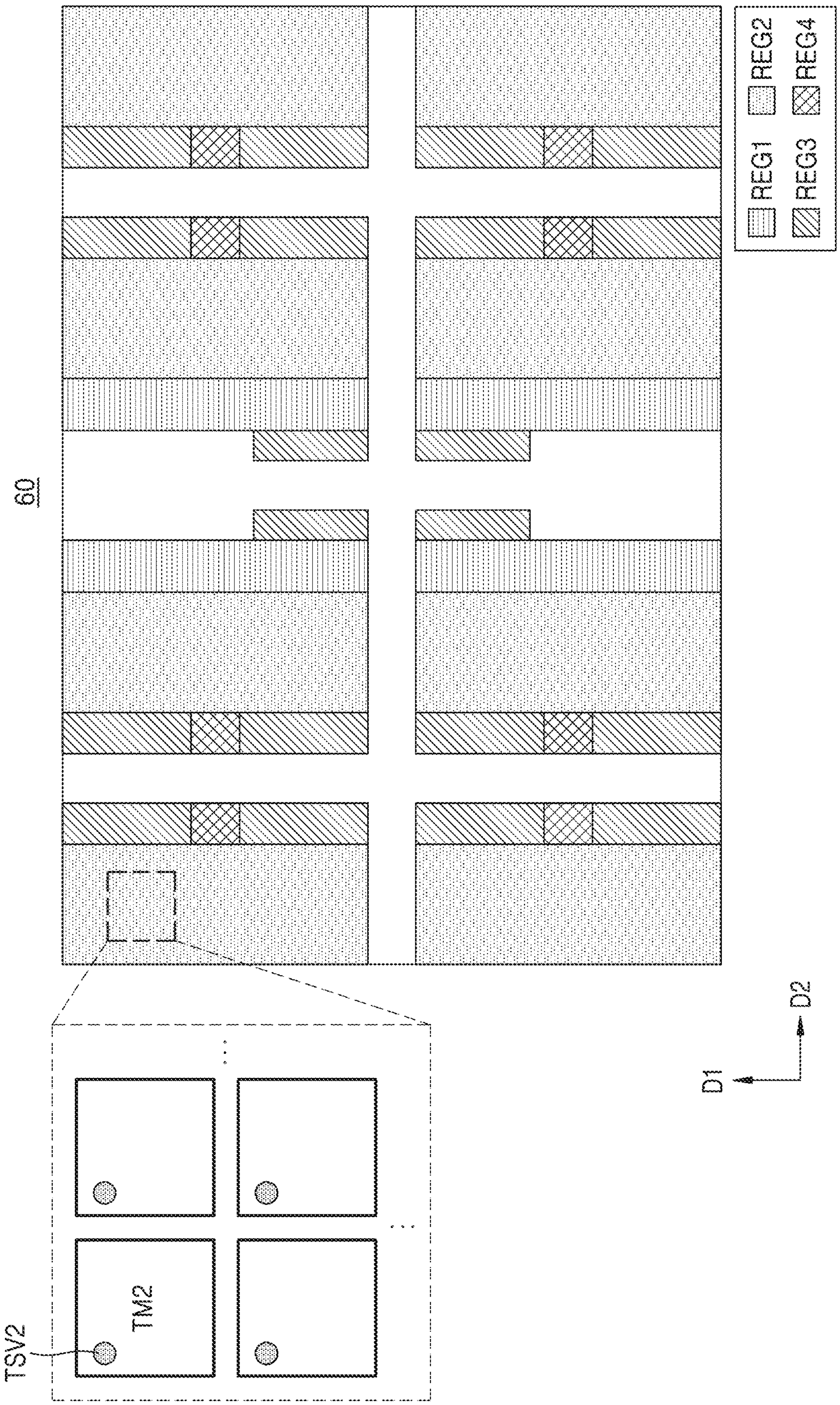
FIG. 17 illustrates an example of a TSV region.

FIG. 17 illustrates an example of a TSV region 60.

Referring to FIGS. 1 and 17 together, the TSV region 60 may correspond to a partial region of the logic die 100, for example, may correspond to one of the TSV region TSV_RG of FIG. 2, the TSV region 101 of FIG. 3A, and the first to fourth TSV regions 101*a* to 101*d* of FIG. 3B. The TSV region 60 includes a plurality of first regions REG1, a plurality of second regions REG2, a plurality of third regions REG3, and a plurality of fourth regions REG4.

A plurality of first TSV macros TM1 may be arranged in the first regions REG1, and each of the first TSV macros TM1 may be provided as the first TSV macro 40*a* of FIG. 7. A plurality of second TSV macros TM2 may be arranged in the second regions REG2, and each of the second TSV macros TM2 may be provided as the second TSV macro 40*b* of FIG. 10. A plurality of third TSV macros TM3 may be arranged in the third regions REG3, and each of the third TSV macros TM3 may be provided as the third TSV macro 40*c* of FIG. 13. A plurality of fourth TSV macros TM4 may be arranged in the fourth regions REG4, and each of the fourth TSV macros TM4 may be provided as the fourth TSV macro 40*d* of FIG. 15.

Figure 18A:
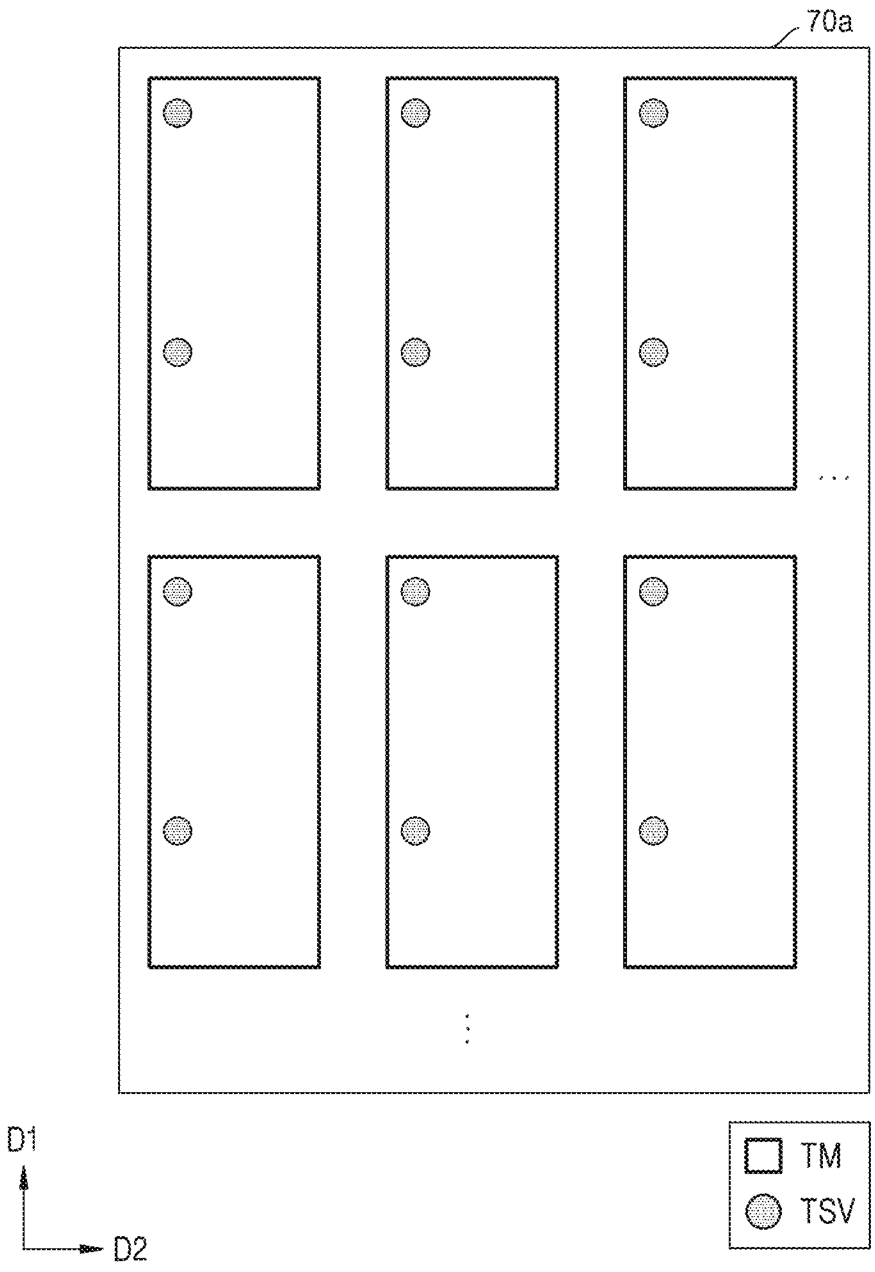
FIGS. 18A and 18B each show an example of a TSV macro array.
Figure 18B:
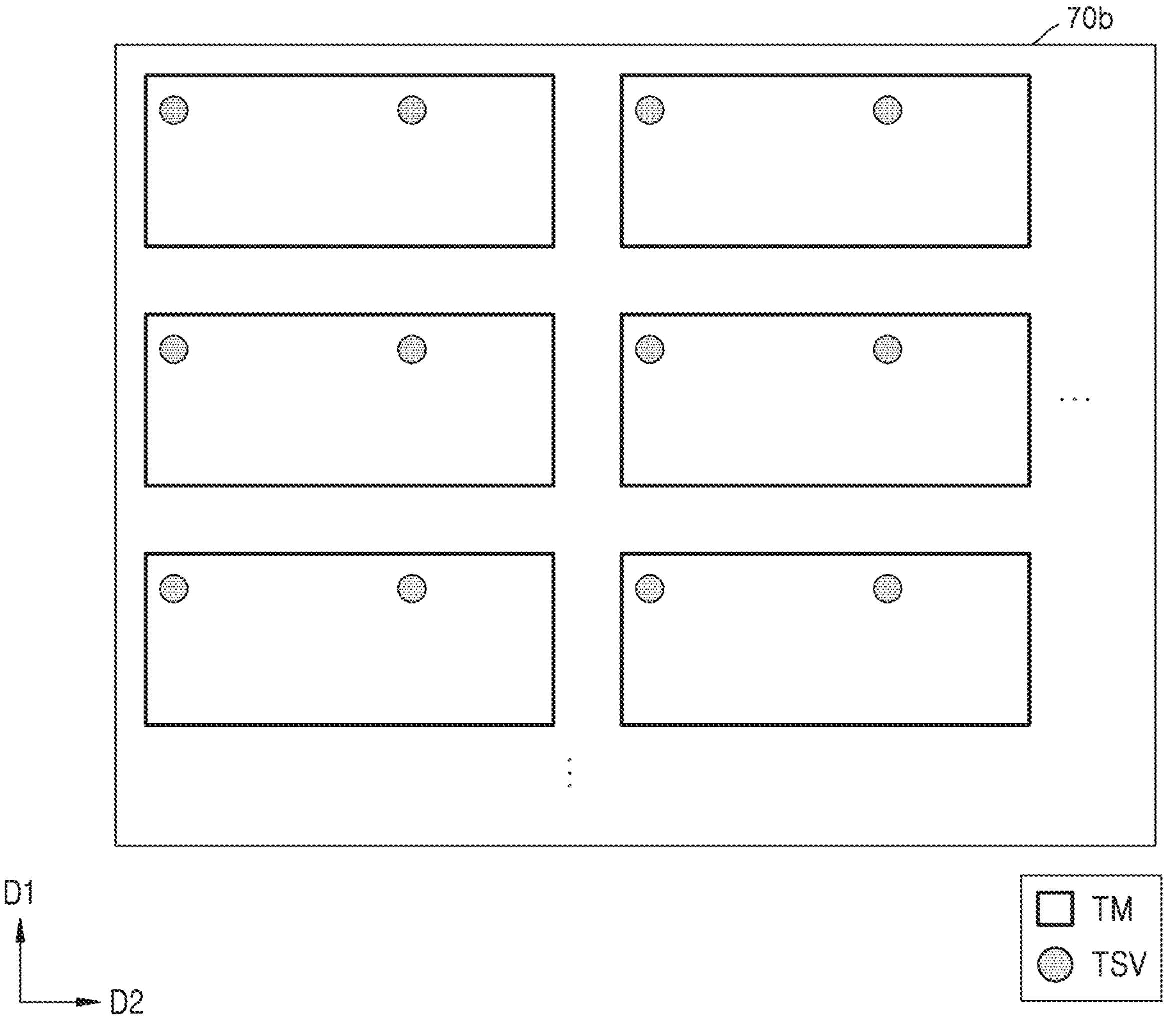

FIGS. 18A and 18B each show an example of a TSV macro array.

Referring to FIGS. 18A and 18B, a TSV macro array 70*a* may include a plurality of TSV macros TM, and each of the TSV macros TM may be connected to two TSVs spaced apart from each other in a first direction D1. Accordingly, each TSV macro TM may have a shape extending in the first direction D1. A TSV macro array 70*b* may include a plurality of TSV macros TM, and each TSV macro TM may be connected to two TSVs spaced apart from each other in a second direction D2. Accordingly, each TSV macro TM may have a shape extending in the second direction D2. In this case, the size of the TSV macro array may be reduced compared to when the TSV macro is connected to one TSV.

Figure 19A:
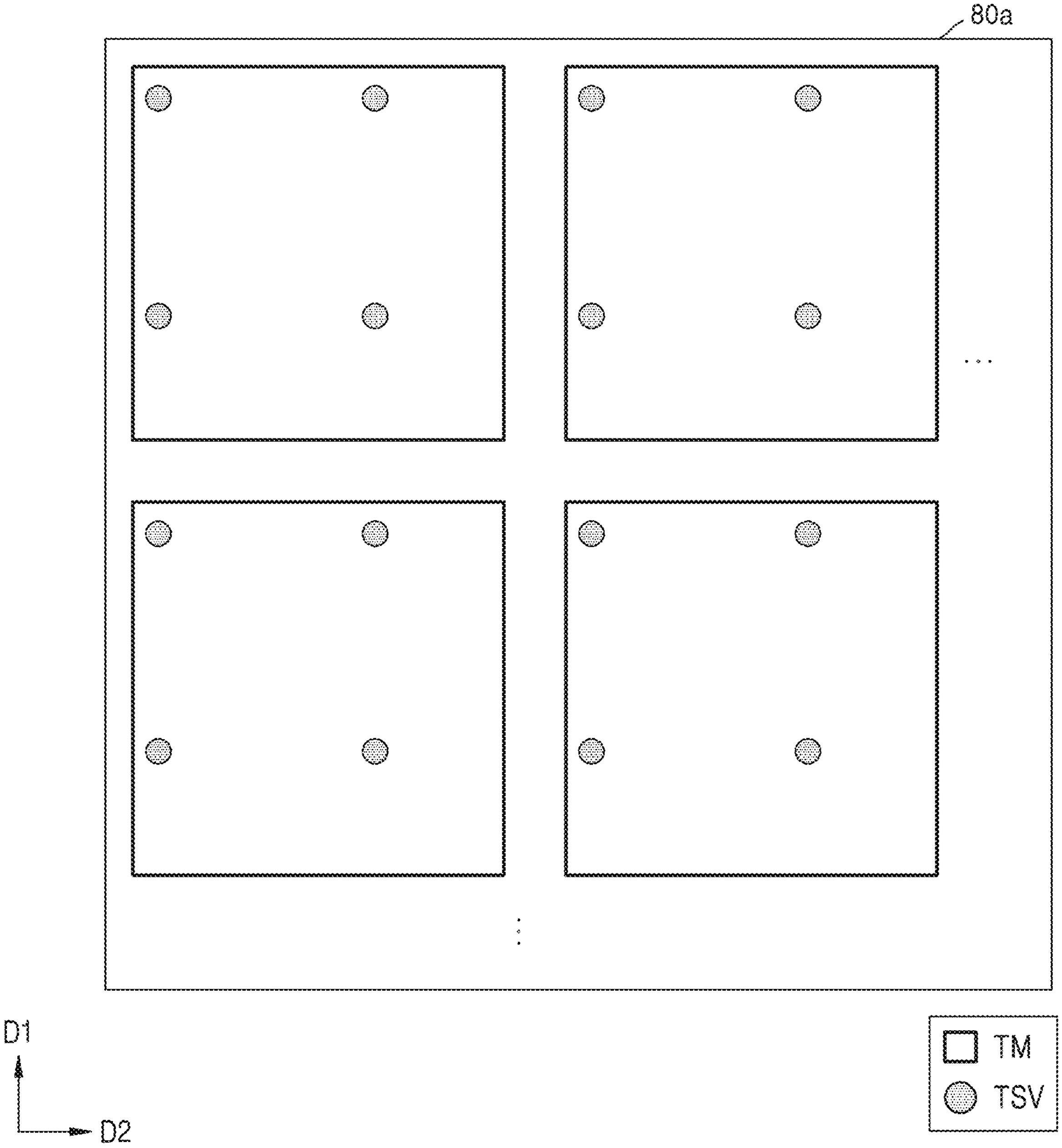
FIGS. 19A, 19B, and 19C each show an example of a TSV macro array.
Figure 19B:
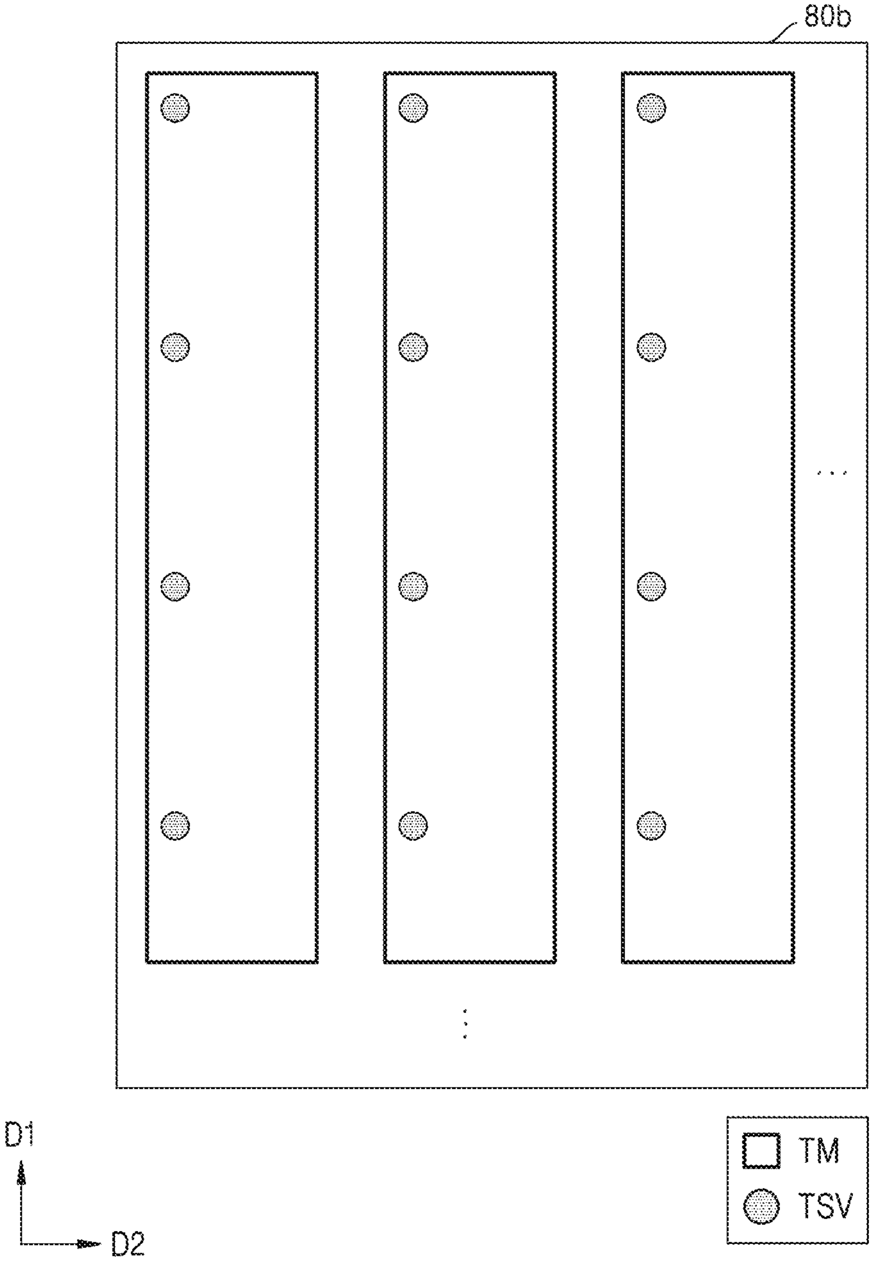
Figure 19C:
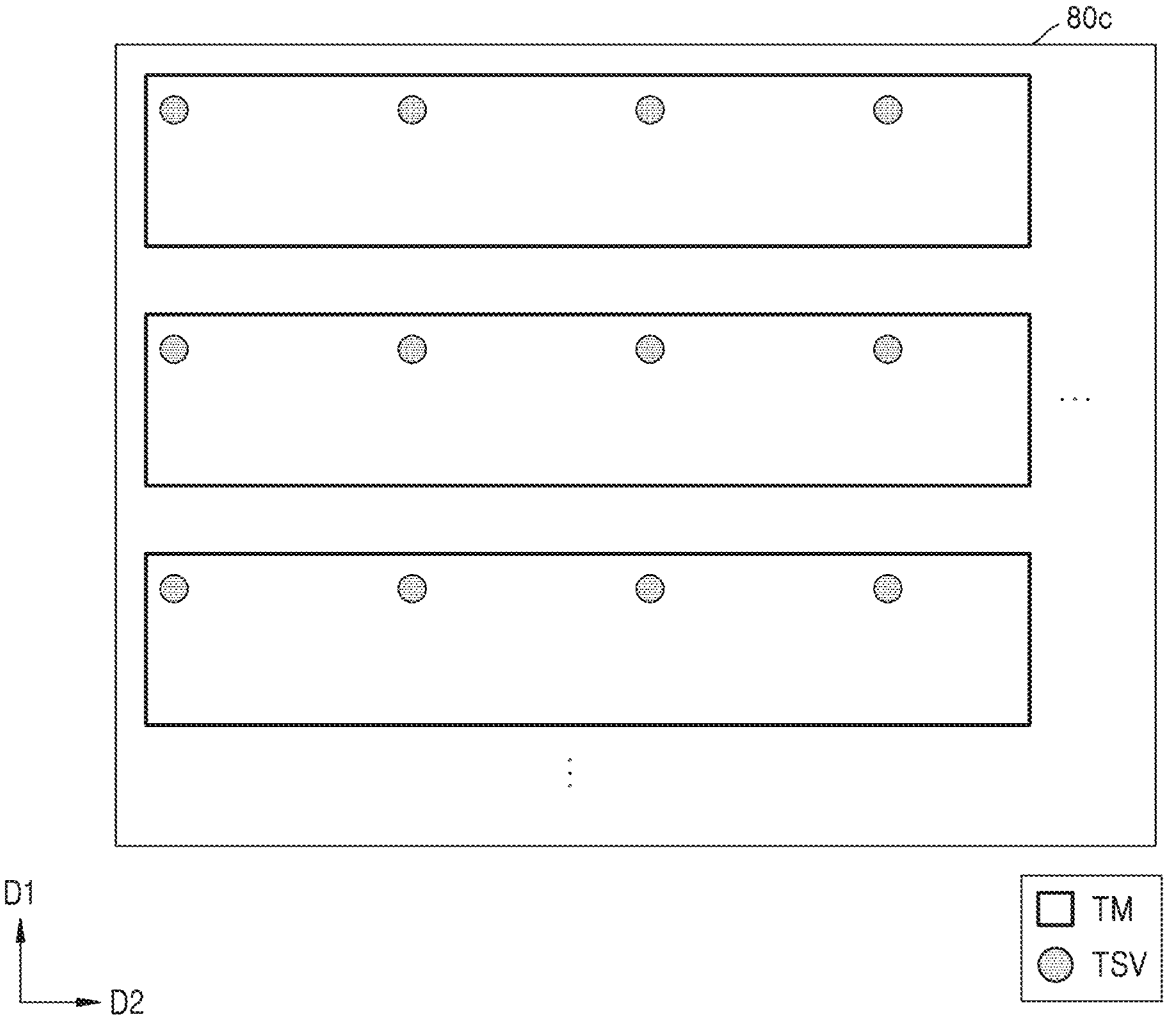

FIGS. 19A, 19B, and 19C each show an example of a TSV macro array.

Referring to FIGS. 19A to 19C, a TSV macro array 80*a* may include a plurality of TSV macros TM, and each TSV macro TM may be connected to four TSVs. A TSV macro array 80*b* may include a plurality of TSV macros TM, and each TSV macro TM may be connected to four TSVs spaced apart from each other in a first direction D1. Accordingly, each TSV macro TM may have a shape extending in the first direction D1. A TSV macro array 80*c* may include a plurality of TSV macros TM, and each TSV macro TM may be connected to four TSVs spaced apart from each other in a second direction D2. Accordingly, each TSV macro TM may have a shape extending in the second direction D2. In this case, the size of the TSV macro array may be reduced compared to when the TSV macro is connected to one TSV, e.g., a single TSV, or connected to two TSVs.

As illustrated in FIGS. 18A to 19C, the number of TSVs arranged above the TSV macro TM and connected to the TSV macro TM may vary. In some implementations, the number of TSVs arranged above the TSV macro TM and connected to the TSV macro TM may be 8 or more. In some implementations, the number of TSVs arranged above the TSV macro TM and connected to the TSV macro TM may be an odd number, such as 3 or 5.

Figure 20A:
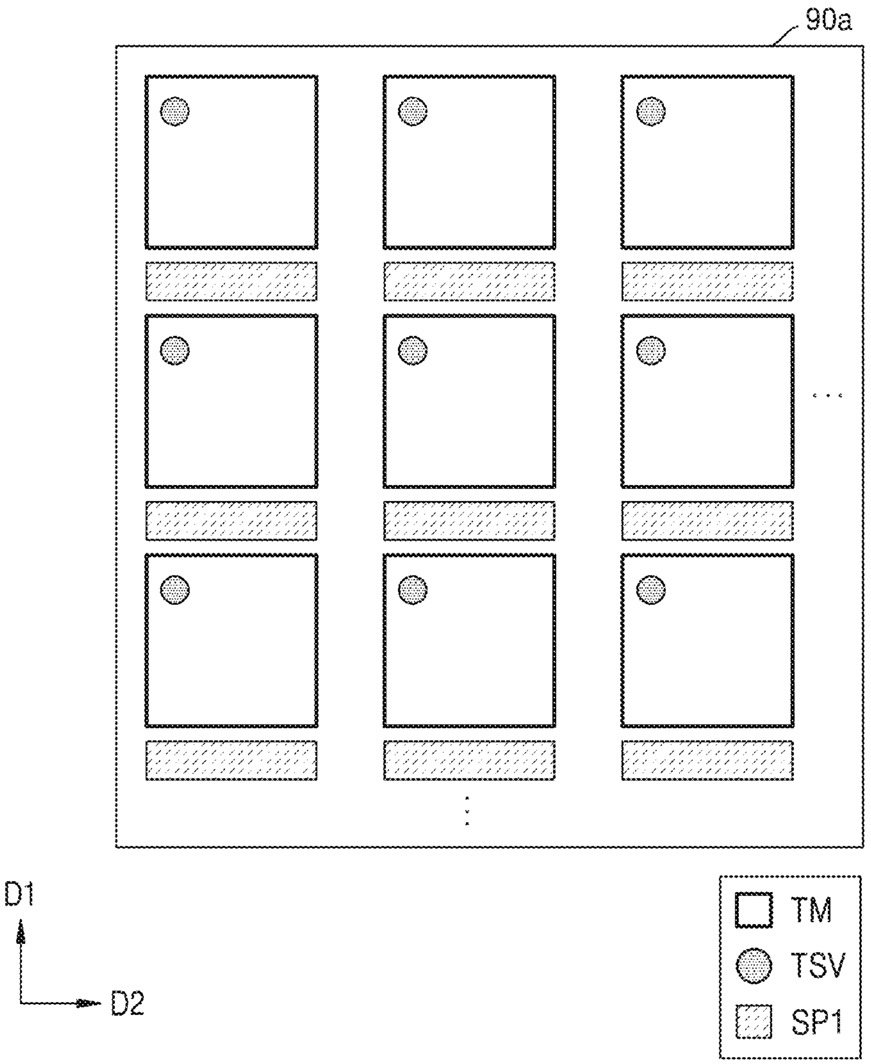
FIGS. 20A, 20B, and 20C each show an example of a TSV macro array.
Figure 20B:
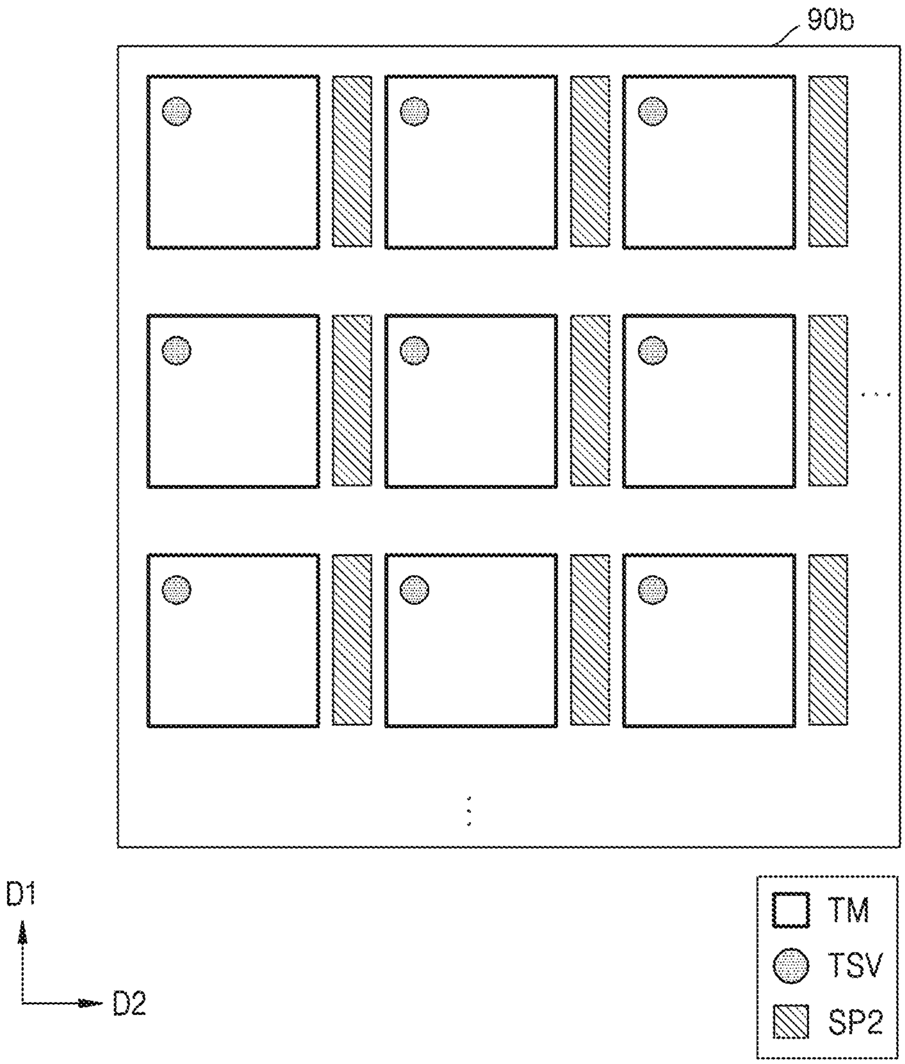
Figure 20C:
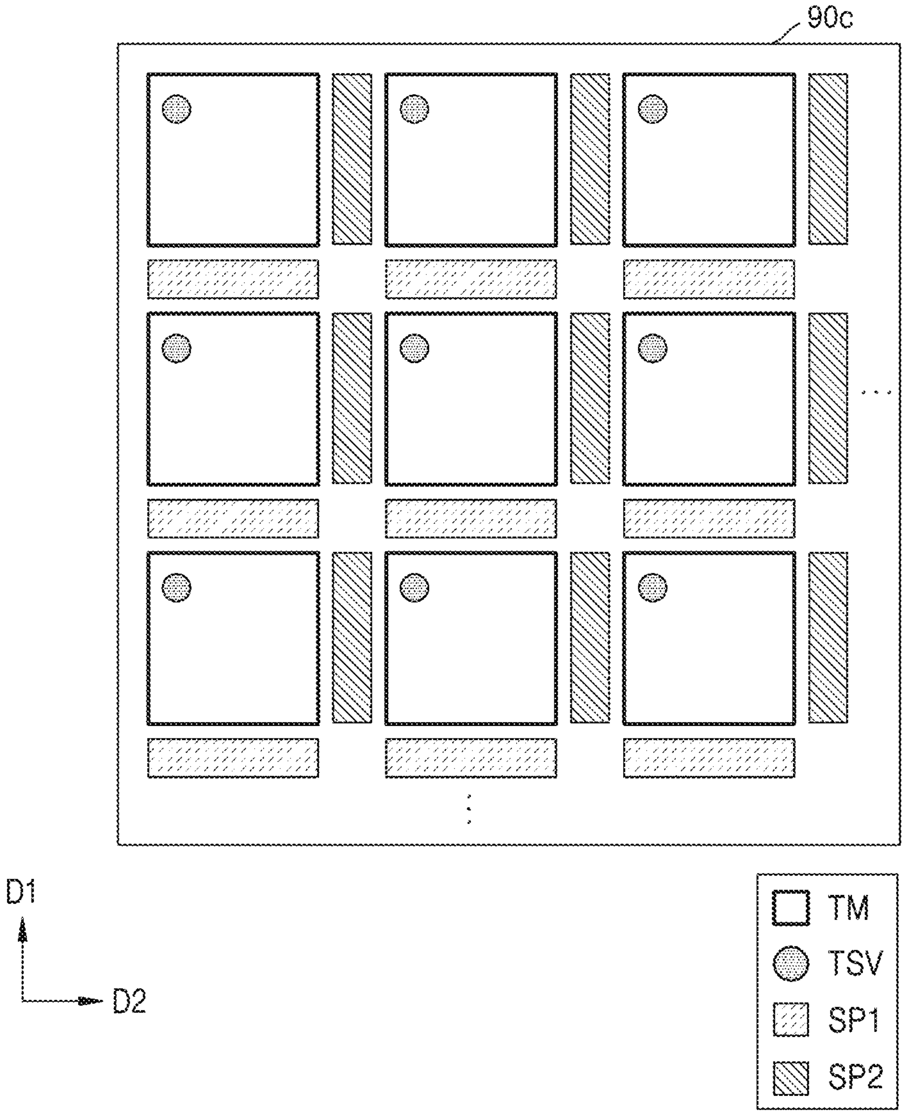

FIGS. 20A to 20C each show an example of a TSV macro array.

Referring to FIGS. 20A to 20C, a TSV macro array 90*a* may include TSV macros TM and first signal processing blocks SP1, and each of the TSV macros TM may be connected to at least one TSV. Each of the first signal processing blocks SP1 may be located between two TSV macros TM adjacent to each other in a first direction D1. A TSV macro array 90*b* may include TSV macros TM and second signal processing blocks SP2, and each of the TSV macros TM may be connected to at least one TSV. Each of the second signal processing blocks SP2 may be located between two TSV macros TM adjacent to each other in a second direction D2. A TSV macro array 90*c* may include TSV macros TM, first signal processing blocks SP1, and second signal processing blocks SP2, and each of the TSV macros TM may be connected to at least one TSV. Each of the first signal processing blocks SP1 may be located between two TSV macros TM adjacent to each other in the first direction D1 and each of the second signal processing blocks SP2 may be located between two TSV macros TM adjacent to each other in the second direction D2.

In some implementations, the first and second signal processing blocks SP1 and SP2 may be provided as soft macros. Accordingly, the first and second signal processing blocks SP1 and SP2 may be referred to as first and second soft macros, respectively. The first and second signal processing blocks SP1 and SP2 may process various signals received from the memory controller and provide these signals to the TSV macros TM. For example, the first and/or second signal processing blocks SP1 and/or SP2 may preprocess the column/row address CA/RA on the basis of the phase of a signal transmitted by the TSV macro TM and provide this signal to the TSV macro TM. For example, the first and/or second signal processing blocks SP1 and/or SP2 may provide a delay control signal that is provided to the delay control logic in the TSV macro TM. For example, the first and/or second signal processing blocks SP1 and/or SP2 may decode information about the temperature of a memory die. For example, the first and/or second signal processing blocks SP1 and/or SP2 may perform a TSV repair function.

Figure 21:
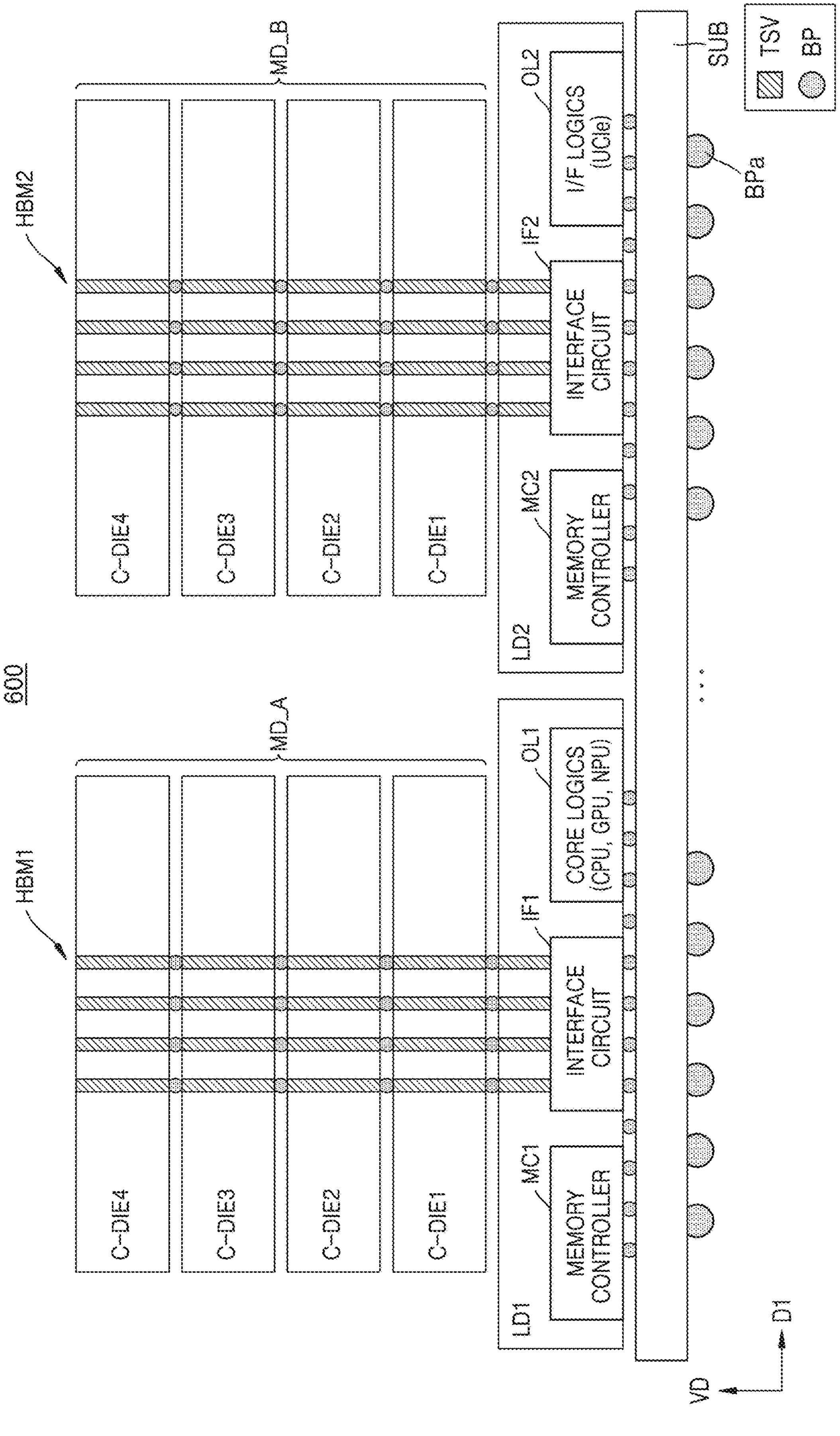
FIG. 21 shows an example of an HBM semiconductor device.

FIG. 21 shows an example of an HBM semiconductor device 600.

Referring to FIG. 21, the HBM semiconductor device 600 includes first and second HBMs HBM1 and HBM2 disposed on a substrate SUB. For example, the first and second HBMs HBM1 and HBM2 may be arranged on the upper surface of the substrate SUB and adjacent to each other in a first direction D1, and the first and second HBMs HBM1 and HBM2 may be electrically connected to the substrate SUB via bumps BP. A plurality of connection terminals, for example, bumps BPa, may be disposed on the lower surface of the substrate SUB, and the substrate SUB may be electrically connected to an external device, for example, a printed circuit board (PCB), via the bumps BPa.

The first HBM HBM1 may include a first logic die LD1 and a plurality of memory dies MD_A stacked on the first logic die LD1 in the vertical direction VD. The second HBM HBM2 may include a second logic die LD2 and a plurality of memory dies MD_B stacked on the second logic die LD2 in the vertical direction VD. For example, each of the plurality of memory dies MD_A and the plurality of memory dies MD_B may include first to fourth core dies C-DIE1 to C-DIE4. The first to fourth core dies C-DIE1 to C-DIE4 may include a plurality of channels having independent interfaces, and thus, each of the first and second HBMs HBM1 and HBM2 may have the increased bandwidth.

The first and second HBMs HBM1 and HBM2 may include logic dies according to the examples described above with reference to FIGS. 1 to 20C. Specifically, the first logic die LD1 of the first HBM HBM1 may include a memory controller MC1, an interface circuit IF1, and core logics OL1. For example, the core logics OL1 may include CPU, GPU, NPU, etc. The second logic die LD2 of the second HBM HBM2 may include a memory controller MC2, an interface circuit IF2, and interface logics OL2. For example, the interface logics OL2 may include a universal chiplet interconnect express (UCIe) module to support an interface protocol between semiconductor chips or semiconductor dies. For example, the interface circuits IF1 and IF2 may include the TSV macros illustrated in FIGS. 1 to 20C.

The first and second HBMs HBM1 and HBM2 may be used for data processing for various purposes. Also, in some implementations, the first and second HBMs HBM1 and HBM2 may be used for neural network operation. For example, the first and second HBMs HBM1 and HBM2 may perform neural network operation, on the basis of other types of models, such as convolutional neural networks (CNN), recurrent neural networks (RNN), multi-layer perceptron (MLP), deep belief networks, and restricted Boltzman machine.

Figure 22A:
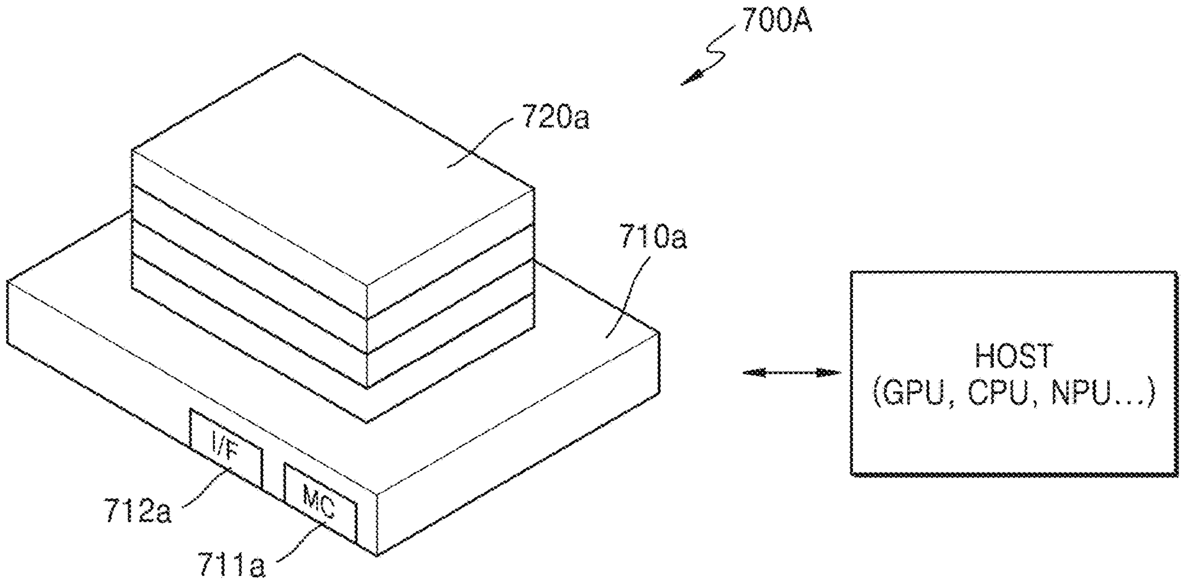
FIGS. 22A and 22B show examples of HBM semiconductor devices.
Figure 22B:
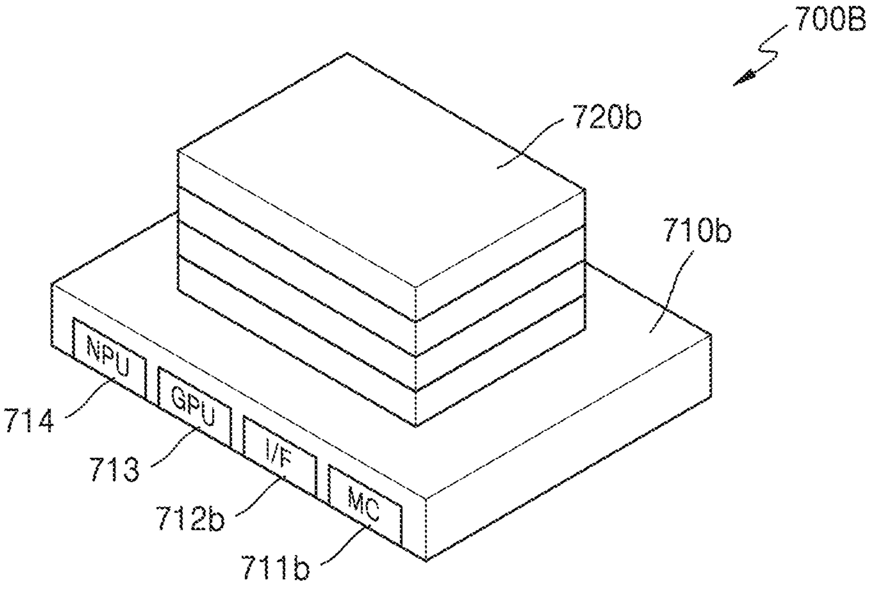

FIGS. 22A and 22B show examples of HBM semiconductor devices.

Referring to FIG. 22A, an HBM semiconductor device 700A includes a logic die 710*a* and HBM core dies 720*a*. For example, the core dies 720*a* can be stacked on the logic die 710*a*. The logic die 710*a* may control memory operations for the core dies 720*a* in response to requests from an external host. For example, the external host may include a CPU, a GPU, an NPU, an APU, and/or an AP. The logic die 710*a* may be electrically connected to a PCB via a plurality of bumps or connection terminals, and the HBM semiconductor device 700A may be provided as a semiconductor package including a PCB. The logic die 710*a* may include a memory controller (or MC) 711*a* and an interface circuit (or I/F) 712*a*, and the interface circuit 712*a* may include the I/O blocks, the TSV circuit blocks, or the TSV macros illustrated in FIGS. 1 to 20C.

Referring to FIG. 22B, an HBM semiconductor device 700B includes a logic die 710*b* and HBM core dies 720*b*. For example, the core dies 720*b* can be stacked on the logic die 710*b*. The logic die 710*b* itself may perform a function as a host and thus control memory operations for the core dies 720*b*. Particularly, the logic die 710*b* may include a memory controller (or MC) 711*b* and an interface circuit (or I/F) 712*b*, and the interface circuit 712*b* may include the I/O blocks, the TSV circuit blocks, or the TSV macros illustrated in FIGS. 1 to 20C. Also, the logic die 710*b* may perform a function as a host and thus include various processing devices, such as a GPU 713 and an NPU 714.

Figure 23A:
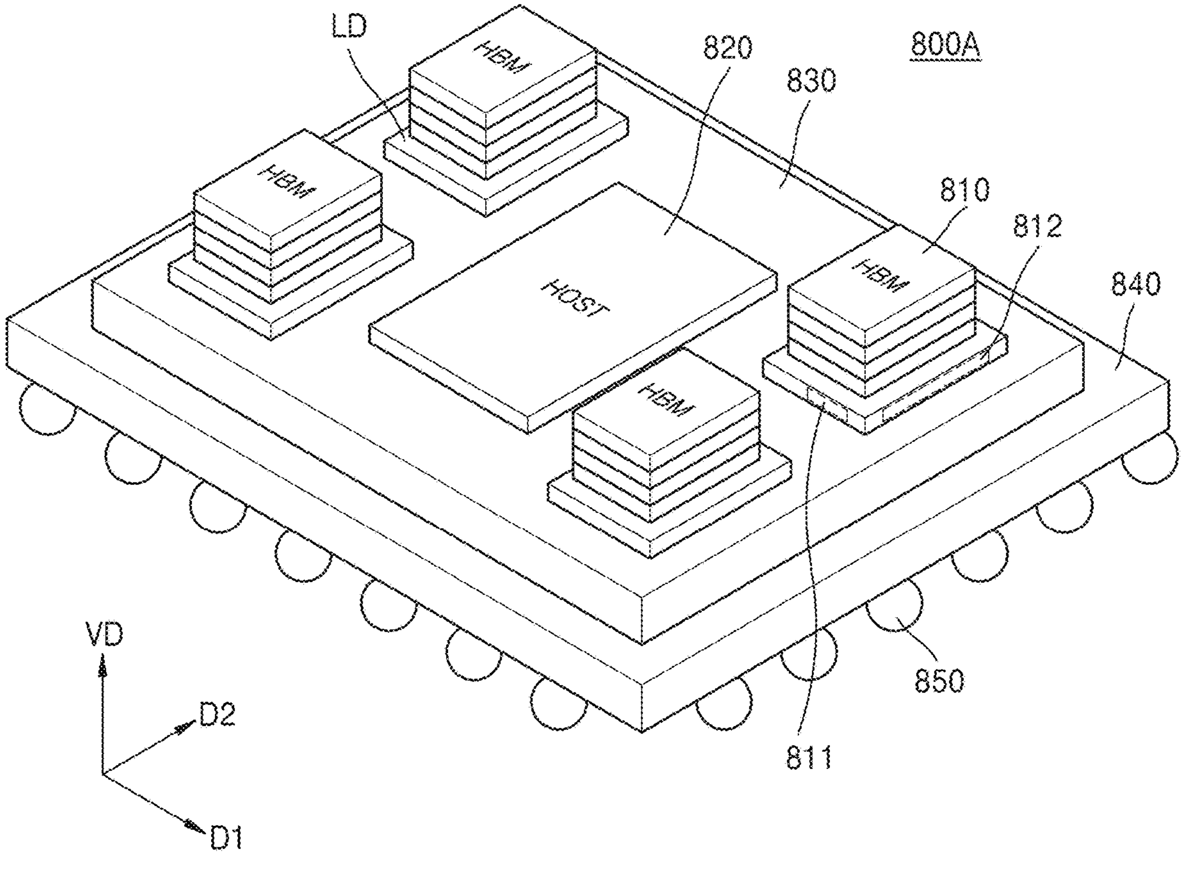
FIGS. 23A and 23B show examples of electronic systems including HBM semiconductor devices.
Figure 23B:
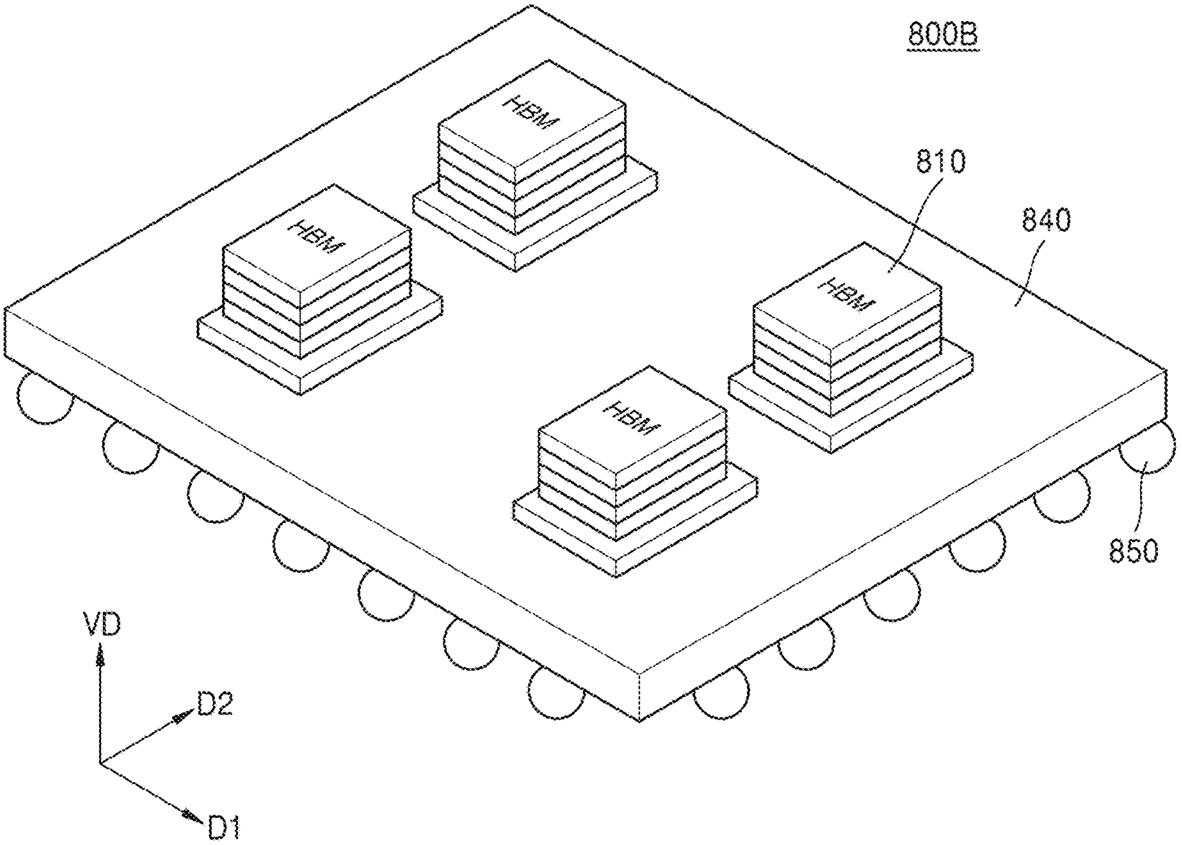

FIGS. 23A and 23B show examples of electronic systems including HBM semiconductor devices.

Referring to FIG. 23A, an electronic system 800A includes one or more HBMs 810 and a host 820. The HBMs 810 and the host 820 are mounted on an interposer 830, and the interposer 830 equipped with the HBMs 810 and the host 820 may be mounted on a package substrate 840. The host 820 may correspond to various semiconductor devices that request memory access.

Each of the HBMs 810 may be provided as a semiconductor device according to the examples described above, and thus, the HBM 810 may include a logic die LD and a plurality of core dies stacked on the logic die LD. In some implementations, the logic die LD may include an interface circuit 811 and a memory controller 812, and the interface circuit 811 may include a plurality of TSV macros respectively connected to a plurality of TSVs in a TSV region. The interface circuit 811 may be configured according to the examples illustrated in FIGS. 1 to 20C. Accordingly, each of the TSV macros may process data and/or signals transmitted and received between the logic die LD and the plurality of core dies via the corresponding TSV, thereby supporting direct interfacing between the memory controller and the plurality of core dies via the TSV.

Also, when the HBM 810 includes a direct access (DA) region, a test signal may be provided into the HBM 810 via the DA region and a conductive means (e.g., a solder ball 850) mounted on the lower portion of the package substrate 840. The interposer 830 may be provided in various forms, such as silicon (TSV) form, PCB form organic, and non-TSV form embedded multi-die interconnect bridge (EMIB).

Referring to FIG. 23B, an electronic system 800B includes one or more HBMs 810. The HBMs 810 may be mounted on a package substrate 840. For example, each of the HBMs 810 may autonomously function as a host. For example, each of the HBMs 810 may be provided as the HBM semiconductor device 700B of FIG. 22B. The logic die in each HBM 810 may be configured according to the examples illustrated in FIGS. 1 to 20C. Accordingly, each of the TSV macros may process data and/or signals transmitted and received between the memory controller and the memory die via the corresponding TSV, thereby supporting direct interfacing between the memory controller and the plurality of core dies via the TSV.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While particular examples are shown and described with reference to the figures, it will be understood that various changes in form and details may be made therein without departing from the spirit and scope of the following claims.

What is claimed is:

1. A semiconductor device comprising:

a logic die comprising a memory controller, an interface circuit, and a plurality of through silicon vias (TSVs) arranged in a TSV region, wherein the memory controller is configured to operate in a first voltage domain; and a plurality of memory dies stacked vertically on the logic die, and connected to the plurality of TSVs, wherein the plurality of memory dies is configured to operate in a second voltage domain, wherein the interface circuit comprises a plurality of TSV circuit blocks being in the TSV region and connected to the plurality of TSVs, wherein the interface circuit is between the memory controller and the plurality of TSV circuit blocks, the interface circuit being configured to process signals transmitted between the memory controller and the plurality of TSV circuit blocks, and wherein each of the plurality of TSV circuit blocks is configured to convert a voltage level of a signal transmitted via a corresponding TSV among the plurality of TSVs, the voltage level being configured to be converted between a first voltage level in the first voltage domain and a second voltage level in the second voltage domain.

2. The semiconductor device of claim 1, wherein each of the plurality of TSV circuit blocks comprises a TSV macro comprising a hard macro, and the interface circuit comprises a TSV macro array comprising a plurality of TSV macros arranged in an array form.

3. The semiconductor device of claim 1, wherein the logic die further comprises a metal layer configured to electrically connect components in the logic die to each other.

4. The semiconductor device of claim 1, wherein each of the plurality of TSV circuit blocks comprises:

a level shifter configured to change the first voltage level of the signal transmitted via the corresponding TSV to the second voltage level; and at least one of a receiver or a transmitter, the receiver being configured to receive the signal having the second voltage level via the corresponding TSV, and the transmitter being configured to transmit the signal having the second voltage level to the plurality of memory dies via the corresponding TSV.

5. The semiconductor device of claim 1, wherein the memory controller is configured to operate in a first clock domain, wherein the plurality of memory dies is configured to operate in a second clock domain, and wherein each of the plurality of TSV circuit blocks is configured to:

synchronize signals received from the plurality of memory dies with a controller clock in the first clock domain; or synchronize a signal received from the memory controller with a memory clock in the second clock domain.

6. The semiconductor device of claim 5, wherein the plurality of TSV circuit blocks comprise a first TSV macro connected to a first TSV among the plurality of TSVs, and the first TSV macro comprises:

a synchronization circuit configured to generate, from a first signal received from the memory controller, a synchronized signal synchronized with the memory clock; and a level shifter configured to change a voltage level of the synchronized signal from the first voltage level to the second voltage level.

7. The semiconductor device of claim 6, wherein the first TSV macro further comprises a delay control logic comprising at least one delay element located between the synchronization circuit and the level shifter.

8. The semiconductor device of claim 6, wherein the first signal received from the memory controller comprises a command or an address.

9. The semiconductor device of claim 5, wherein the plurality of TSV circuit blocks comprise a second TSV macro connected to a second TSV among the plurality of TSVs, and wherein the second TSV macro comprises:

a write path configured to generate, from write data received from the memory controller, first synchronized data synchronized with the memory clock; and a level shifter configured to change a voltage level of the first synchronized data from the first voltage level to the second voltage level.

10. The semiconductor device of claim 9, wherein the write data comprises first write data and second write data, wherein the first write data and the second write data are received in parallel from the memory controller, and wherein the write path is configured to generate, from the first write data and the second write data, serial write data synchronized with the memory clock as the first synchronized data.

11. The semiconductor device of claim 9, wherein the second TSV macro further comprises a read path configured to generate, from read data received via the second TSV, second synchronized data synchronized with the controller clock.

12. The semiconductor device of claim 11, wherein the read path generates, from the read data, first read data and second read data in parallel, and wherein the first and second read data are synchronized with the controller clock.

13. The semiconductor device of claim 11, wherein the second TSV macro further comprises a delay control logic comprising at least one delay element located between the level shifter and at least one of the write path or the read path.

14. The semiconductor device of claim 5, wherein the plurality of TSV circuit blocks comprise a third TSV macro connected to a third TSV among the plurality of TSVs, and the third TSV macro comprises:

a serializer circuit configured to generate, from first write data and second write data received in parallel from the memory controller, a clock signal synchronized with the memory clock; and a level shifter configured to change a voltage level of the clock signal from the first voltage level to the second voltage level.

15. The semiconductor device of claim 14, wherein the third TSV macro further comprises a delay control logic comprising at least one delay element located between the serializer circuit and the level shifter.

16. The semiconductor device of claim 14, wherein the third TSV macro further comprises a transmitter configured to output, to the third TSV, the clock signal having the voltage level changed by the level shifter.

17. The semiconductor device of claim 5, wherein the plurality of TSV circuit blocks comprise a fourth TSV macro connected to a fourth TSV among the plurality of TSVs, and the fourth TSV macro comprises:

a receiver configured to receive a read clock signal in the second clock domain from the plurality of memory dies; and a delay control logic configured to generate a memory read clock signal by delaying the read clock signal for a certain period of time.

18. The semiconductor device of claim 1, wherein each of the plurality of TSV circuit blocks is connected to one TSV of the plurality of TSVs.

19. A logic die comprising:

a memory controller configured to operate in a first clock domain;

a plurality of through silicon vias (TSVs) arranged in a TSV region and electrically connected to a plurality of memory dies configured to operate in a second clock domain; and an interface circuit between the memory controller and the plurality of TSVs, the interface circuit comprising a plurality of TSV circuit blocks being in the TSV region and connected to the plurality of TSVs, wherein the interface circuit is between the memory controller and the plurality of TSV circuit blocks, the interface circuit being configured to process signals transmitted between the memory controller and the plurality of TSV circuit blocks, wherein the interface circuit comprises a plurality of TSV macros arranged, in the TSV region, in an array form and connected to the plurality of TSVs, and wherein each of the plurality of TSV macros is configured to:

synchronize signals received from the plurality of memory dies with a controller clock in the first clock domain, or synchronize a signal received from the memory controller with a memory clock in the second clock domain.

20. A logic die comprising:

a memory controller configured to operate in a first voltage domain; and a plurality of through silicon vias (TSVs) arranged in a TSV region and electrically connected to a plurality of memory dies configured to operate in a second voltage domain; and an interface circuit between the memory controller and the plurality of TSVs, the interface circuit comprising a plurality of TSV circuit blocks being in the TSV region and connected to the plurality of TSVs, wherein the interface circuit is between the memory controller and the plurality of TSV circuit blocks, the interface circuit being configured to process signals transmitted between the memory controller and the plurality of TSV circuit blocks, wherein the interface circuit comprises a plurality of TSV macros arranged, in the TSV region, in an array form and connected to the plurality of TSVs, and wherein each of the plurality of TSV macros is configured to convert a voltage level of a signal, transmitted via a corresponding TSV among the plurality of TSVs, to a converted level between a first voltage level in the first voltage domain and a second voltage level in the second voltage domain.

* * * * *